US012581769B2

(12) United States Patent
Kim et al.

(10) Patent No.: US 12,581,769 B2
(45) Date of Patent: Mar. 17, 2026

(54) CHIP WET TRANSFER APPARATUS

(71) Applicant: SAMSUNG ELECTRONICS CO., LTD., Suwon-si (KR)

(72) Inventors: Hyunjoon Kim, Suwon-si (KR); Kyungwook Hwang, Suwon-si (KR); Dongkyun Kim, Suwon-si (KR); Dongho Kim, Suwon-si (KR); Joonyong Park, Suwon-si (KR); Minchul Yu, Suwon-si (KR); Seogwoo Hong, Suwon-si (KR); Junsik Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 604 days.

(21) Appl. No.: 18/086,992

(22) Filed: Dec. 22, 2022

(65) Prior Publication Data

US 2024/0006199 A1 Jan. 4, 2024

(30) Foreign Application Priority Data

Jul. 4, 2022 (KR) ........................ 10-2022-0082130

(51) Int. Cl.
*H10H 20/01* (2025.01)
*H01L 21/67* (2006.01)
*H01L 21/68* (2006.01)

(52) U.S. Cl.
CPC ....... *H10H 20/01* (2025.01); *H01L 21/67144* (2013.01); *H01L 21/68* (2013.01)

(58) Field of Classification Search
CPC .................. H10H 20/01; H10H 20/018; H01L 21/67144; H01L 21/68; H01L 21/67011; H01L 21/67259; H01L 24/75; H01L 2224/757; H01L 2224/759
See application file for complete search history.

(56) References Cited

U.S. PATENT DOCUMENTS

| | | | |
|---|---|---|---|
| 7,080,444 | B1 | 7/2006 | Craig et al. |
| 9,722,145 | B2 | 8/2017 | Sasaki et al. |
| 9,825,202 | B2 | 11/2017 | Schuele et al. |

(Continued)

FOREIGN PATENT DOCUMENTS

| | | |
|---|---|---|
| KR | 10-2020-0021969 A | 3/2020 |
| KR | 10-2022-0083538 A | 6/2022 |

OTHER PUBLICATIONS

Wong et al., "Size-independent peak efficiency of III-nitride micro-light-emitting-diodes using chemical treatment and sidewall passivation", Applied Physics Express, 2019, vol. 12, No. 097004, pp. 1-4 (5 pages total).

(Continued)

*Primary Examiner* — Sunil K Singh
*Assistant Examiner* — Jose K Abraham
(74) *Attorney, Agent, or Firm* — Sughrue Mion, PLLC

(57) ABSTRACT

A chip wet transfer apparatus includes a first chip supply module configured to supply a large amount of micro-semiconductor chips to a transfer substrate, a first chip alignment module configured to align the large amount of micro-semiconductor chips in a plurality of grooves, a second chip supply module configured to supply a small amount of micro-semiconductor chips, and a second chip alignment module configured to align the small amount of micro-semiconductor chips.

19 Claims, 18 Drawing Sheets

(56) References Cited

U.S. PATENT DOCUMENTS

| | | | | |
|---|---|---|---|---|
| 9,917,226 | B1 | 3/2018 | Heine et al. | |
| 10,243,097 | B2 * | 3/2019 | Yuen | H10H 20/01 |
| 10,418,527 | B2 | 9/2019 | Sasaki et al. | |
| 10,475,958 | B2 | 11/2019 | Zhan et al. | |
| 10,777,714 | B2 | 9/2020 | Sasaki et al. | |
| 10,825,702 | B2 | 11/2020 | Shim et al. | |
| 11,296,059 | B2 * | 4/2022 | Sasaki | H01L 25/0753 |
| 11,616,043 | B2 * | 3/2023 | Chen | H01L 24/16 |
| | | | | 257/737 |
| 11,699,690 | B2 * | 7/2023 | Shih | H01L 22/22 |
| | | | | 257/88 |
| 2006/0220988 | A1 * | 10/2006 | Hillis | H01L 24/95 |
| | | | | 345/30 |
| 2007/0082464 | A1 * | 4/2007 | Schatz | H01L 21/6776 |
| | | | | 438/458 |
| 2020/0194323 | A1 * | 6/2020 | Bellman | H01L 23/49822 |
| 2020/0279835 | A1 | 9/2020 | Sasaki et al. | |
| 2020/0286870 | A1 | 9/2020 | Sasaki et al. | |
| 2021/0358893 | A1 | 11/2021 | Shim et al. | |
| 2022/0157790 | A1 | 5/2022 | Sasaki et al. | |
| 2022/0189810 | A1 | 6/2022 | Hwang et al. | |
| 2022/0320379 | A1 * | 10/2022 | Ahn | H01L 21/67 |
| 2023/0059135 | A1 * | 2/2023 | Chang | H01L 25/0753 |
| 2023/0163248 | A1 | 5/2023 | Kim et al. | |

OTHER PUBLICATIONS

Communication issued Sep. 27, 2024 by the Korean Intellectual Property Office in Korean Patent Application No. 10-2022-0082130.

Communication issued Nov. 28, 2023 by the European Patent Office in European Patent Application No. 23155615.0.

* cited by examiner

CHIP WET TRANSFER APPARATUS

CROSS-REFERENCE TO RELATED APPLICATION

This application is based on and claims priority under 35 U.S.C. § 119 to Korean Patent Application No. 10-2022-0082130, filed on Jul. 4, 2022, in the Korean Intellectual Property Office, the disclosure of which is incorporated by reference herein in its entirety.

BACKGROUND

1. Field

The disclosure relates to a chip wet transfer apparatus.

2. Description of the Related Art

A liquid crystal display (LCD) and an organic light-emitting diode (OLED) display are widely used as display devices. Recently, technology for manufacturing a high-resolution display device by using a micro light-emitting diode has been in the spotlight.

A micro-semiconductor chip, for example, a light-emitting diode (LED), has low power consumption and is eco-friendly. Due to these advantages, industrial demand for LEDs is increasing. LEDs are applied not only to lighting devices or LCD backlights, but also to LED display devices. That is, a display device using a micro-unit LED chip is being developed. In manufacturing a micro LED display device, it is necessary to transfer micro LEDs to a substrate. A pick-and-place method is widely used as a method of transferring micro LEDs. However, with this method, as the size of a micro LED decreases and the size of a display increases, productivity is reduced.

SUMMARY

Provided is an apparatus for aligning micro-semiconductor chips by using a wet method.

Additional aspects will be set forth in part in the description which follows and, in part, will be apparent from the description, or may be learned by practice of embodiments.

In accordance with an aspect of the disclosure, a chip wet transfer apparatus is disclosed for transferring a plurality of micro-semiconductor chips to a transfer substrate, the transfer substrate including a plurality of grooves, the chip wet transfer apparatus including a first chip supply module configured to supply, to the transfer substrate, a first suspension including the plurality of micro-semiconductor chips and a liquid; a first chip alignment module configured to align the plurality of micro-semiconductor chips of the first suspension in one or more of the plurality of grooves; a second chip supply module configured to supply a second suspension including the plurality of micro-semiconductor chips and the liquid, the second suspension having a smaller volume than a volume of the first suspension, to the transfer substrate; and a second chip alignment module configured to align the plurality of micro-semiconductor chips of the second suspension in grooves from among the plurality of grooves that remain empty after the plurality of micro-semiconductor chips included in the first suspension are aligned.

The chip wet transfer apparatus may further include an inspection module configured to inspect a state of the transfer substrate after operations of the first chip supply module and the first chip alignment module; and a controller configured to control operations of the second chip supply module and the second chip alignment module, based on the inspected state of the transfer substrate.

The controller may be further configured to transfer the plurality of micro-semiconductor chips included in the second suspension to the empty grooves by controlling an operation of at least one of the second chip supply module and the second chip alignment module when a ratio of a number of the empty grooves to a number of all of the plurality of grooves of the transfer substrate is equal to or greater than a reference value.

The controller may be further configured to divide the transfer substrate into a plurality of areas, for each of the plurality of areas, determine whether the ratio of the number of the empty grooves to the number of all of the plurality of grooves is equal to or greater than the reference value, and control the operation of the at least one of the second chip supply module and the second chip alignment module to transfer the plurality of micro-semiconductor chips included in the second suspension to an area from among the plurality of areas of the transfer substrate having the ratio equal to or greater than the reference value.

The reference value may be equal to or less than 0.1%.

An area to which the plurality of micro-semiconductor chips included in the second suspension is supplied may be equal to or less than $\frac{1}{10}$ of an area to which the plurality of micro-semiconductor chips included in the first suspension is supplied.

The first chip supply module may supply the first suspension while moving along a surface of the transfer substrate.

A density of the plurality of micro-semiconductor chips included in the second suspension may be less than a density of the plurality of micro-semiconductor chips included in the first suspension.

The second chip supply module may be further configured to sequentially transfer the plurality of micro-semiconductor chips to the transfer substrate one by one.

The first chip supply module and the second chip supply module may share a chip storage module in which the first suspension and the second suspension are stored.

The first chip supply module may be connected to a lower end of the chip storage module, and the second chip supply module may be connected to a side end of the chip storage module.

The chip wet transfer apparatus may further include a first valve configured to control a flow of the first suspension from the chip storage module to the first chip supply module; and a second valve configured to control a flow of the second suspension from the chip storage module to the second chip supply module.

The chip wet transfer apparatus may further include a controller configured to control operations of the second chip supply module and the second chip alignment module, wherein, while the second valve is opened so that the second chip supply module supplies the second suspension, the controller is configured to control the first valve to be maintained in a locked state.

The chip wet transfer apparatus may further include a chip filtration module configured to separate the plurality of micro-semiconductor chips from impurities in the first suspension and the second suspension, wherein the chip filtration module is further configured to move the first suspension from which the impurities are removed to the first chip supply module or move the second suspension from which the impurities are removed to the second chip supply module.

The impurities may include damaged micro-semiconductor chips.

The chip filtration module may be further configured to separate the plurality of micro-semiconductor chips from the impurities by using at least one of sonophoretic dynamics, dielectrophoretic dynamics, magnetophoretic dynamics, microfluidic dynamics, a centrifugal force, and pinched flow fractionation.

A pressure applied by the second chip alignment module to the transfer substrate may be less than a pressure applied by the first chip alignment module to the transfer substrate.

The first chip alignment module may include a first absorbent material for absorbing the liquid of the first suspension, the second chip alignment module may include a second absorbent material for absorbing the liquid of the second suspension, and a temporary contact area between the second absorbent material and the transfer substrate may be equal to or less than $\frac{1}{10}$ of a temporary contact area between the first absorbent material and the transfer substrate.

The first chip alignment module may include a first support having a first bar shape whose central axis is parallel to a surface of the transfer substrate, wherein the first absorbent material is located on a side surface of the first support, and the second chip alignment module may include a second support having a second bar shape whose central axis is perpendicular to the surface of the transfer substrate, wherein the second absorbent material is located on an end portion of the second support facing the transfer substrate.

The first support may be rotatable in a first direction parallel to the surface of the transfer substrate, and the second support may be horizontally movable in a second direction parallel to the surface of the transfer substrate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
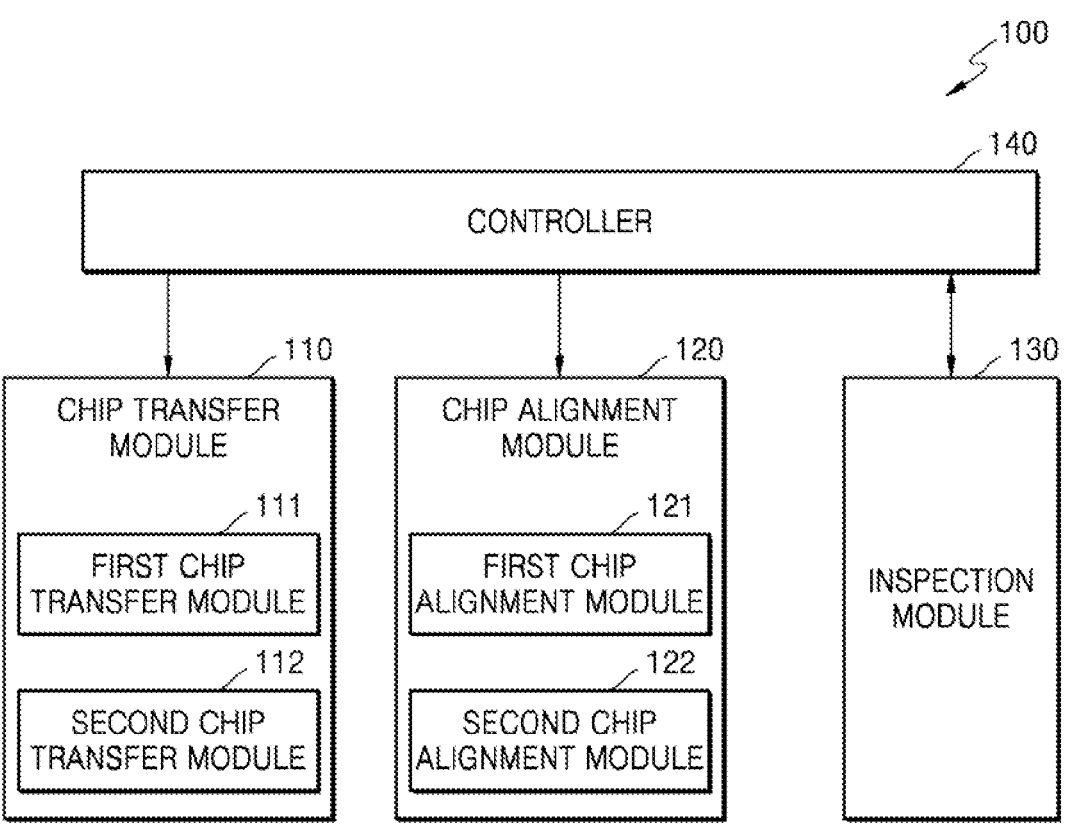
FIG. 1 is a block diagram schematically illustrating a chip wet transfer apparatus, according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a chip wet transfer apparatus according to various embodiments will be described in detail with reference to the accompanying drawings. Like reference numerals denote like elements throughout, and in the drawings, sizes of elements may be exaggerated for clarity and convenience of explanation. It will be understood that although the terms "first," "second," etc. may be used herein to describe various elements, these elements should not be limited by these terms. The above terms are used only to distinguish one element from another.

The singular forms "a," "an," and "the" are intended to include the plural forms as well, unless the context clearly indicates otherwise. When a portion "includes" an element, another element may be further included, rather than excluding the existence of the other element, unless otherwise described. Sizes or thicknesses of elements may be exaggerated for clarity of explanation. It will also be understood that when a material layer is referred to as being "on" another layer or a substrate, the material layer may be directly on the other layer or the substrate, or intervening layers may also be present therebetween. A material of each layer in the following embodiments is merely an example, and thus, other materials may be used.

The term used in the embodiments such as " . . . unit" or "module" indicates a unit for processing at least one function or operation, and may be implemented in hardware, software, or in a combination of hardware and software.

Specific execution methods described in embodiments are examples, and a technical scope is not limited by any method. For the sake of brevity, conventional electronics, control systems, software, and other functional aspects of the systems may not be described in detail. Also, lines or members connecting elements illustrated in the drawings are merely illustrative of functional connections and/or physical or circuit connections. In an actual device, the connections between elements may be represented by various functional connections, physical connections, or circuit connections that are replaceable or added.

The use of the terms "a" and "an," and "the" and similar referents in the context of describing the disclosure is to be construed to cover both the singular and the plural.

The steps of all methods described herein may be performed in any suitable order unless otherwise indicated herein or otherwise clearly contradicted by context. The use of any and all examples, or example language (e.g., "such as") provided herein, is intended merely to better illuminate the disclosure and does not pose a limitation on the scope of the disclosure unless otherwise claimed.

Figure 2:
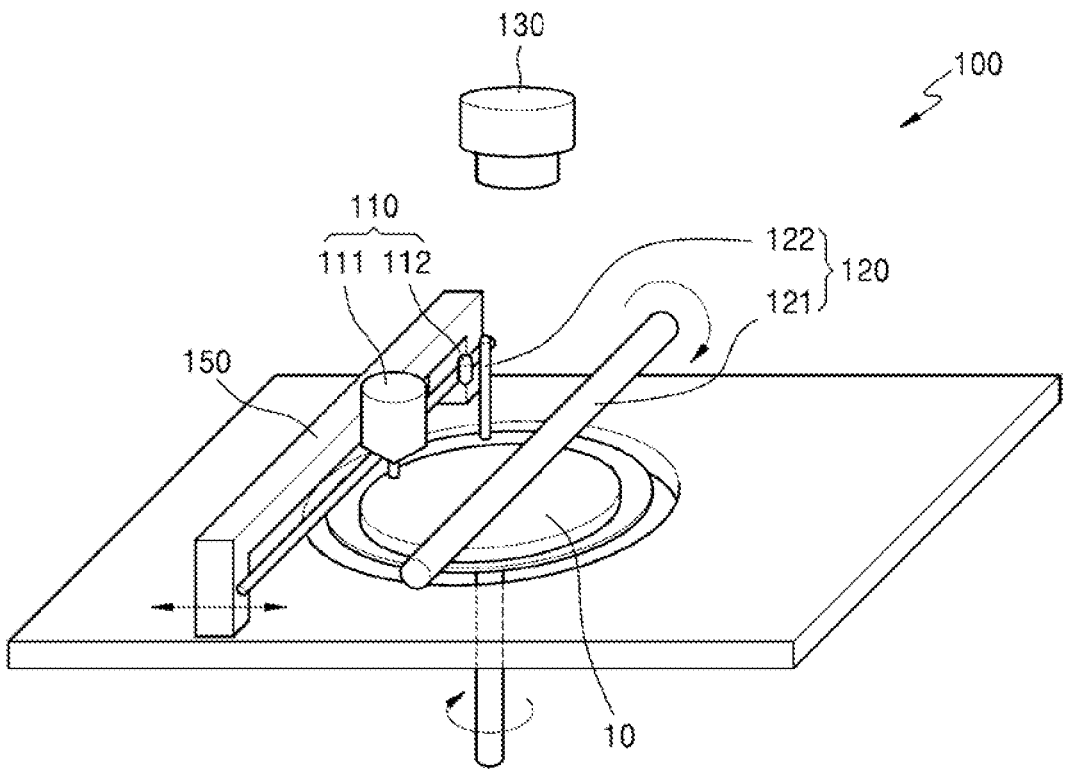
FIG. 2 is a view illustrating a part of an outer appearance of the chip wet transfer apparatus of FIG. 1.
Figure 3:
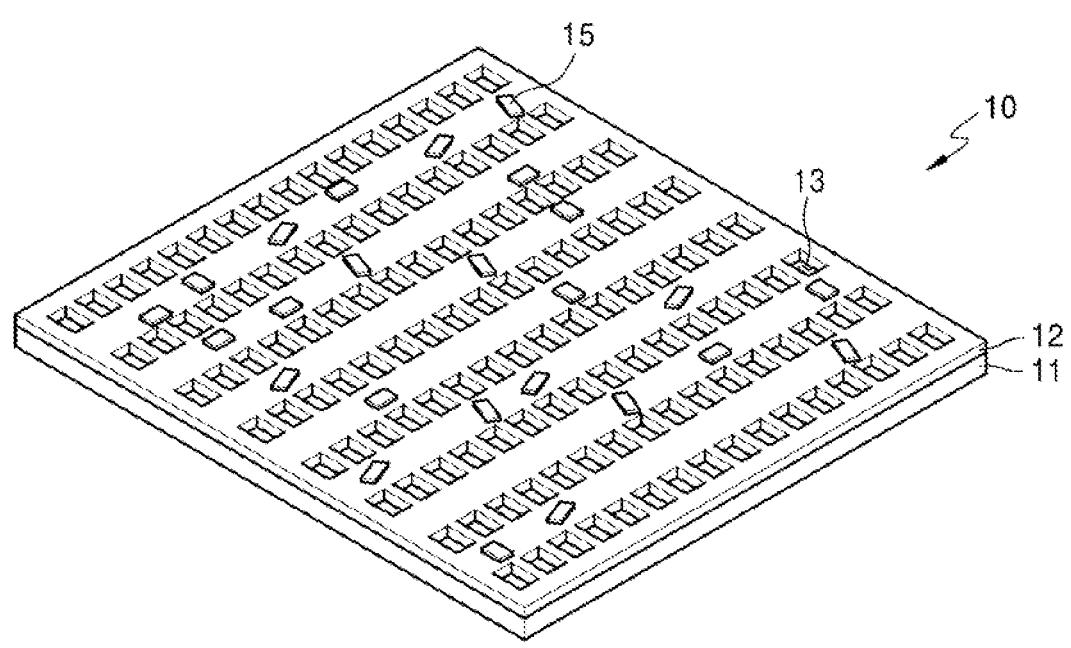
FIG. 3 is a view for describing a transfer substrate having a plurality of holes, according to an embodiment.

FIG. 1 is a block diagram schematically illustrating a chip wet transfer apparatus, according to an embodiment. FIG. 2 is a view illustrating a part of an outer appearance of the chip wet transfer apparatus of FIG. 1. FIG. 3 is a view for describing a transfer substrate 10 having a plurality of holes, according to an embodiment.

Referring to FIGS. 1 through 3, a chip wet transfer apparatus 100 may align a plurality of micro-semiconductor chips 15 in a plurality of grooves 13 of the transfer substrate 10. The chip wet transfer apparatus 100 may include a chip transfer module 110 for transferring the micro-semiconductor chips 15 and a liquid to the transfer substrate 10 and a chip alignment module 120 for aligning the micro-semiconductor chips 15 in the plurality of grooves.

The chip wet transfer apparatus 100 may further include an inspection module 130 for inspecting a state of the transfer substrate 10, and controller 140 for controlling operations of the chip transfer module 110 and the chip alignment module 120, based on a result of the inspection by the inspection module 130.

Referring to FIG. 3, the transfer substrate 10 may include the plurality of grooves 13 into which the micro-semiconductor chips 15 may be inserted. Each of the plurality of grooves 13 may have a size sufficient to insert at least a part of the micro-semiconductor chip 15. For example, the groove 13 may have a size in micro units. For example, a size of the groove 13 may be less than 1000 μm, for example, 500 μm or less, 200 μm or less, or 100 μm or less. A size of the groove 13 may be greater than a size of the micro-semiconductor chip 15.

An interval between the plurality of grooves 13 may correspond to an interval between the micro-semiconductor chips 15 inserted into the grooves 13. For example, when the micro-semiconductor chips 15 are light-emitting devices, an interval between the plurality of grooves 13 may correspond to a pixel interval of a display device used in a final product. However, an interval between the plurality of grooves 13 is not limited thereto, and may be modified in various ways.

The transfer substrate 10 may include a plurality of layers. For example, the transfer substrate 10 may include a base substrate 11 and a guide mold 12. Materials of the base substrate 11 and the guide mold 12 may be different from each other or may be the same. Alternatively, the transfer substrate 10 may include a single layer. Also, a planar shape of the transfer substrate 10 may be a quadrangular shape as shown in FIG. 3, but the disclosure is not limited thereto. For example, a planar shape of the transfer substrate 10 may be a circular shape.

Figure 4:
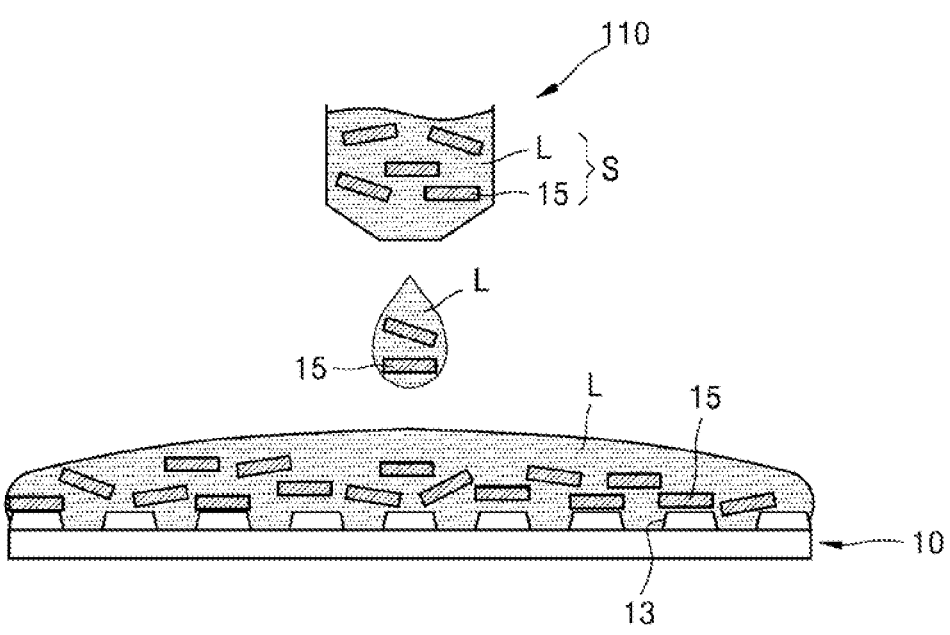
FIG. 4 is a reference view for describing a method by which a chip transfer module transfers micro-semiconductor chips to a transfer substrate, according to an embodiment.

FIG. 4 is a reference view for describing a method by which a chip transfer module transfers the micro-semiconductor chips 15 to the transfer substrate according to an embodiment.

The chip transfer module 110 may supply a suspension S including a liquid L and the micro-semiconductor chips 15.

The chip transfer module 110 may supply the suspension S including a plurality of micro-semiconductor chips 15 and the liquid L to the transfer substrate 10 so that the plurality of micro-semiconductor chips are movable on the transfer substrate 10.

When the suspension S is supplied to the transfer substrate 10, as shown in FIG. 4, the liquid L included in the suspension S may form a thin film on the transfer substrate 10, and at least parts of the plurality of micro-semiconductor chips may be immersed in the liquid L.

Because the plurality of micro-semiconductor chips 15 are immersed in the liquid L, the plurality of micro-semiconductor chips 15 may be movable on the transfer substrate 10. In this case, the liquid L supplied to the transfer substrate 10 may be thinly formed on the transfer substrate 10 so that the plurality of micro-semiconductor chips 15 are movable but are prevented or minimized from being unintentionally moved by the chip alignment module 120 described below.

For example, the liquid L may be maintained on the transfer substrate without a separate configuration (e.g., a water tank) for maintaining the liquid L on the transfer substrate 10. The liquid L supplied onto the transfer substrate 10 may have a surface convex upward due to surface tension or the like. A height of the liquid L may be reduced toward an edge of the transfer substrate 10. A height of the liquid L supplied onto the transfer substrate 10 may be equal to or less than 20 times a thickness of the micro-semiconductor chip 15. A height of the liquid L supplied onto the transfer substrate 10 may be equal to or less than 10 times a thickness of the micro-semiconductor chip 15. A height of the liquid L supplied onto the transfer substrate 10 may be equal to or less than 5 times a thickness of the micro-semiconductor chip 15. A height of the liquid L supplied onto the transfer substrate 10 may be equal to or less than twice a thickness of the micro-semiconductor chip 15. A height of the liquid L may be defined, for example, as an average height of the liquid L across the surface of the transfer substrate 10.

The liquid L may be any liquid as long as the liquid L does not corrode or damage the micro-semiconductor chip 15. The liquid L may include at least one of, for example, water, ethanol, alcohol, polyol, ketone, halocarbon, acetone, flux, or an organic solvent. The organic solvent may include, for example, isopropyl alcohol (IPA). The liquid L is not limited thereto, and various modifications may be made.

The micro-semiconductor chip 15 may have a size in micro units. For example, a width, diameter, or thickness of the micro-semiconductor chip 15 may be about 1000 μm or less, or 200 μm or less, or 100 μm or less, or 50 μm or less. A width, diameter, or thickness of the micro-semiconductor chip 15 may be about 1 μm or more.

The micro-semiconductor chip 15 may be a micro light-emitting device. However, the micro-semiconductor chip 15 is not limited thereto, and may be any member having a size in micro units. For example, the micro-semiconductor chip 15 may be a pressure sensor, a photodiode, a thermistor, a piezoelectric element, or the like.

The micro-semiconductor chip 15 may have a symmetrical planar shape. For example, a planar shape of the micro-semiconductor chip 15 may be a square shape, a circular shape, a triangular shape, or a cube shape.

An electrode may be located on an end portion of the micro-semiconductor chip 15. The micro-semiconductor chip 15 may be arranged in the groove so that, even when the micro-semiconductor chip 15 rotates while the micro-semiconductor chip 15 is aligned in a groove h in a subsequent step, the electrode of the micro-semiconductor chip 15 is located at a certain position, for example, faces the groove.

Figure 5:
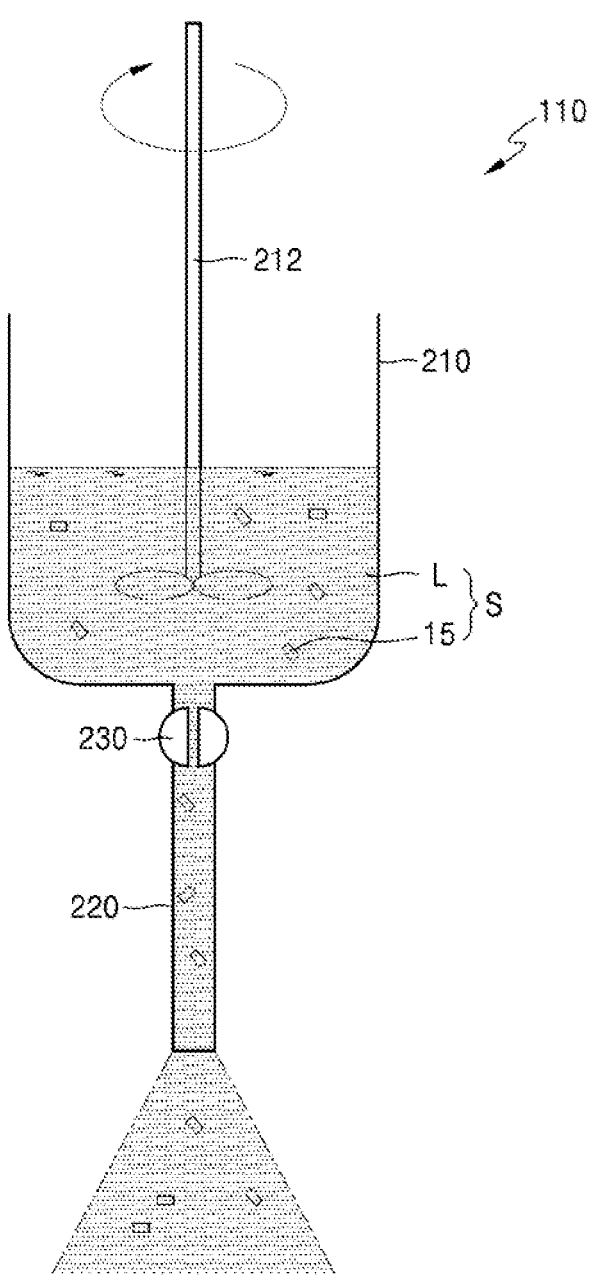
FIG. 5 is a view schematically illustrating a chip transfer module, according to an embodiment.

FIG. 5 is a view schematically illustrating the chip transfer module 110, according to an embodiment. Referring to FIG. 5, the chip transfer module 110 may include a chip storage module 210 in which the suspension S in which the plurality of micro-semiconductor chips 15 and the liquid L are mixed is stored, a chip supply module 220 for supplying the suspension S to the transfer substrate 10, and a valve 230 for controlling a movement of the suspension S from the chip storage module 210 to the chip supply module 220. The plurality of micro-semiconductor chips 15 in the suspension S stored in the chip storage module 210 has a specific gravity greater than that of the liquid L. A specific gravity of the micro-semiconductor chip 15 may be equal to or greater than 2 times, for example, 4 times, for example, 6 times, a specific gravity of the liquid L. A specific gravity of the micro-semiconductor chip 15 may be equal to or less than 40 times a specific gravity of the liquid L.

As such, when a specific gravity of the micro-semiconductor chip 15 is greater than a specific gravity of the liquid L, the plurality of micro-semiconductor chips 15 may be in a sinking state before being supplied from the chip storage module 210. For example, the plurality of micro-semiconductor chips 15 may be gathered at a lower end portion of the chip storage module 210. In this state, when the suspension S is supplied from the chip storage module 210, a supply amount of the micro-semiconductor chips 15 may not be constant. In particular, when the chip supply module 220 is located at a lower end of the chip storage module 210, a large amount of the micro-semiconductor chips 15 may be unintentionally supplied at once.

To prevent this, the chip storage module 210 may be configured so that the plurality of micro-semiconductor chips 15 included in the suspension S are evenly mixed. For example, the chip storage module 210 may further include a stirrer 212 located in the suspension S to mix the suspension S. The stirrer 212 may be configured so that the stirrer 212 collides with the micro semiconductor chips 15 but does not damage the micro-semiconductor chips 15. For example, the stirrer 212 may have a strength less than that of the micro-semiconductor chips 15, or may have an elastic deformation force greater than that of the micro-semiconductor chips 15. In an example, the stirrer 212 may mix the micro-semiconductor chips 15 by applying vibration to the chip storage module 210 or pivoting the chip storage module 210.

The chip transfer module 110 according to an embodiment may include a plurality of chip transfer modules. Referring to FIG. 2, for example, the chip transfer module 110 may include a first chip transfer module 111 for supplying a suspension including a large amount of micro-semiconductor chips 15 and a liquid to the transfer substrate 10 and a second chip transfer module 112 for supplying a suspension including a small amount of micro-semiconductor chips 15 and a liquid to the transfer substrate 10. The suspension including the large amount of micro-semiconductor chips 15 and the liquid supplied by the first chip transfer module 111 may be referred to as a first suspension, and the suspension including the small amount of micro-semiconductor chips 15 and the liquid supplied by the second chip transfer module 112 may be referred to as a second suspension.

After the micro-semiconductor chips 15 are supplied to the transfer substrate 10 by the first chip transfer module 111, the micro-semiconductor chips 15 may be supplied by the second chip transfer module 112 to empty grooves in which the micro-semiconductor chips 15 are not aligned under the control of the controller 140 described below. The first chip transfer module 111 may be a main transfer module, and the second chip transfer module 112 may be an additional transfer module. However, the disclosure is not limited thereto. After the micro-semiconductor chips 15 are supplied to the transfer substrate 10 by the first chip transfer module 111 and the second chip transfer module 112, the micro-semiconductor chips 15 may be supplied by the second chip transfer module 112 to empty grooves in which the micro-semiconductor chips 15 are not aligned under the control of the controller 140.

Each of the first chip transfer module 111 and the second chip transfer module 112 may include the chip storage module 210 in which the micro-semiconductor chips 15 are stored and the chip supply module 220 for supplying the micro-semiconductor chips 15, and sizes of the chip storage modules 210 and the chip supply modules 220 of the first chip transfer module 111 and the second chip transfer module 112 may be different from each other. For example, the chip storage module 210 and the chip supply module 220 of the first chip transfer module 111 may be greater than the chip storage module 210 and the chip supply module 220 of the second chip transfer module 112.

The first chip transfer module 111 and the second chip transfer module 112 may have different supply amounts of the micro-semiconductor chips 15. For example, a cross-sectional size of the chip supply module 220 of the first chip transfer module 111 may be different from a cross-sectional size of the chip supply module 220 of the second chip transfer module 112. For example, an area to which a second suspension S2 is supplied by the second chip transfer module 112 in a unit time period may be equal to or less than $\frac{1}{10}$ of an area to which a first suspension S1 is supplied by the first chip transfer module 111 in the unit time period. In other words, a volume of the first suspension S1 supplied by the first chip transfer module 111 in the unit time period may be larger than a volume of the second suspension S2 supplied by the second chip transfer module 112 in the unit time period.

The first chip transfer module 111 and the second chip transfer module 112 may have different supply densities of the micro-semiconductor chips 15. A density of the micro-semiconductor chips 15 in the first suspension S1 may be different from a density of the micro-semiconductor chips 15 in the second suspension S2. For example, a density of the micro-semiconductor chips 15 supplied by the second chip transfer module 112 in a unit time period may be less than a density of the micro-semiconductor chips 15 supplied by the first chip transfer module 111 in the unit time period. For example, the first chip transfer module 111 may supply 100 or more micro-semiconductor chips 15 for one time whereas the second chip transfer module 112 may supply one micro-semiconductor chip 15 for one time.

Referring to FIG. 2, the first chip transfer module 111 and the second chip transfer module 112 may be attached to a moving member 150 that moves horizontally with respect to a surface of a transfer substrate 10.

Although each of the first chip transfer module 111 and the second chip transfer module 112 includes the chip storage module 210 and the chip supply module 220, the disclosure is not limited thereto. The first chip transfer module 111 and the second chip transfer module 112 may share the chip storage module.

Figure 6:
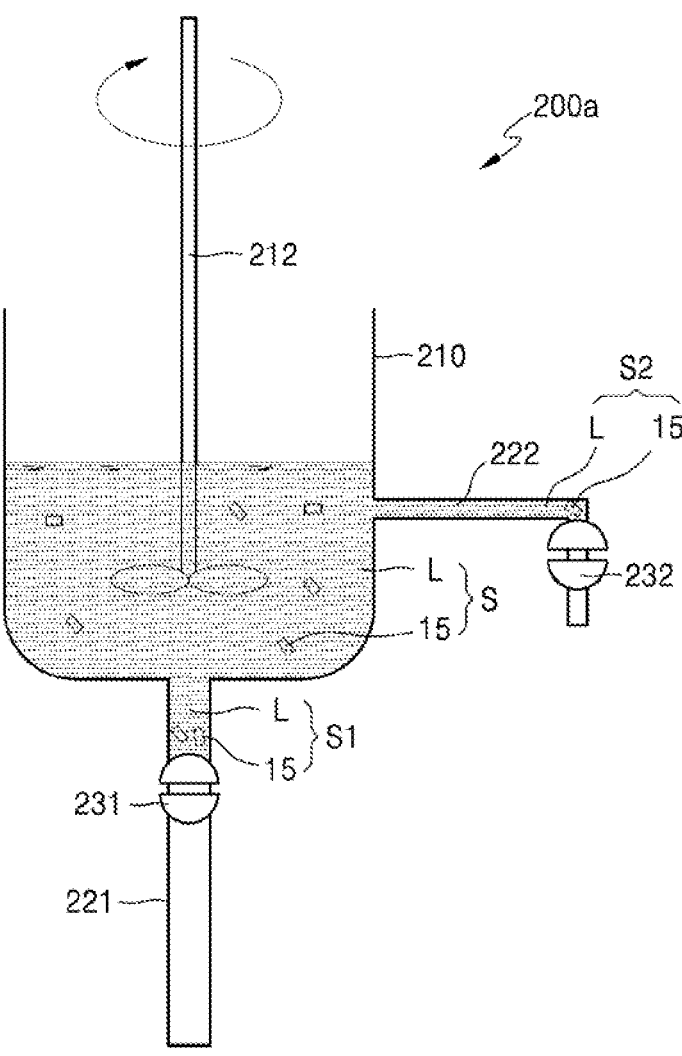
FIG. 6 is a view illustrating a chip transfer module that shares a chip storage module, according to an embodiment.

FIG. 6 is a view illustrating a chip transfer module 200*a* in which a chip storage module 210 is shared between a first chip supply module 221 and a second chip supply module 222, according to an embodiment.

Referring to FIG. 6, the chip transfer module 200a may include the chip storage module 210 in which the suspension S in which the plurality of micro-semiconductor chips 15 and the liquid L are mixed is stored, a plurality of chip supply modules, e.g., first and second chip supply modules 221 and 222, for supplying the suspension S to the transfer substrate 10, and a plurality of valves, e.g., first and second valves 231 and 232, for selectively introducing the suspension S from the chip storage module 210 into the first and second chip supply modules 221 and 222. For example, the chip transfer module 200a may include the first chip supply module 221 located at a lower end of the chip storage module 210, the second chip supply module 222 located at a side end of the chip storage module 210, the first valve 231 for controlling a movement of the suspension S between the chip storage module 210 and the first chip supply module 221, and the second valve 232 for controlling a movement of the suspension S between the chip storage module 210 and the second chip supply module 222.

A supply cross-section of the first chip supply module 221 may be greater than a supply cross-section of the second chip supply module 222. For example, a supply cross-section of the first chip supply module 221 may be equal to or greater than 10 times a supply cross-section of the second chip supply module 222. Because a specific gravity of the micro-semiconductor chips 15 is greater than that of the liquid, a density of the micro-semiconductor chips 15 supplied by the second chip supply module 222 located at the side end of the chip storage module 210 may be equal to or less than that of the micro-semiconductor chips 15 supplied by the first chip supply module 221.

A relatively large amount of micro-semiconductor chips 15 may be supplied to the transfer substrate 10 when the first valve 231 is opened, and a relatively small amount of micro-semiconductor chips 15 may be supplied to the transfer substrate 10 when the second valve 232 is opened. However, the disclosure is not limited thereto. When a large amount of micro-semiconductor chips 15 is supplied, both the first and second valves 231 and 232 may be opened.

Impurities 16 in addition to the micro-semiconductor chips 15 may be further present in the suspension S included in the chip storage module 210. For example, in a process of preparing the suspension S by growing and separating the micro-semiconductor chips 15 on a silicon or sapphire substrate and then putting the separated micro-semiconductor chips 15 in the liquid L, the impurities 16, which are materials different from the micro-semiconductor chips 15, may also be introduced. In another example, in a process of mixing the suspension S to have a uniform concentration, the micro-semiconductor chips 15 may collide with the stirrer, or the micro-semiconductor chips 15 may collide with each other, thereby generating the impurities 16 as fragments. Accordingly, the impurities 16 are materials different from the micro-semiconductor chips 15 in at least one of a size and a mass. The impurities 16 may be materials different from the micro-semiconductor chips 15, or may be parts of the micro-semiconductor chips 15, that is, damaged micro-semiconductor chips 15.

In an example, other types of micro-semiconductor chips 15 may be wet-transferred by the same chip transfer module 110. The micro-semiconductor chips 15 used in a previous wet transfer process may remain in the chip storage module 210, and unwanted micro-semiconductor chips 15 may be erroneously transferred to the transfer substrate 10. The above-described other types of micro-semiconductor chips may have different sizes, masses, etc. compared to current micro-semiconductor chips 15 to be transferred, and previously used micro-semiconductor chips may be the impurities 16 from a viewpoint of the current micro-semiconductor chips 15 to be transferred.

When the impurities 16 undesirably included in a suspension storage process, the impurities 16 that may be generated during a stirring process, and the impurities that are other micro-semiconductor chips 15 remaining from a previous transfer process are transferred together, a transfer yield of the chip transfer module 200a is lowered.

Figure 7:
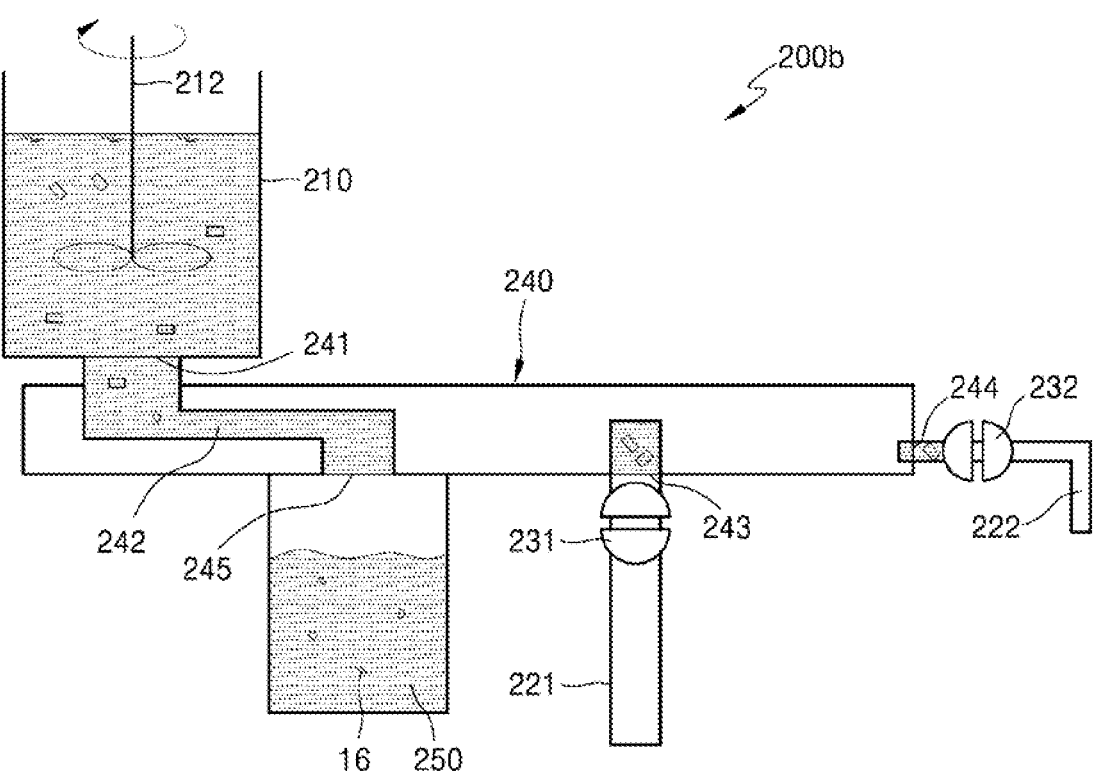
FIG. 7 is a view illustrating a chip transfer module including a chip filtration module, according to an embodiment.

FIG. 7 is a view illustrating the chip transfer module 110 including a chip filtration module, according to an embodiment. The chip transfer module 110 according to an embodiment may further include a chip filtration module 240 for separating the micro-semiconductor chips 15 from the impurities 16 in the suspension S. When the suspension S is introduced from the chip storage module 210, the chip filtration module 240 may separate the micro-semiconductor chips 15 from the impurities 16 in the suspension S and may provide only the suspension S including only the micro-semiconductor chips 15 to the first and second chip supply modules 221 and 222. Because the micro-semiconductor chips 15 that meet certain requirements are supplied to the transfer substrate 10, a transfer yield of the chip transfer module 110 may be increased.

The chip filtration module 240 may further include an inlet 241 through which the suspension S is introduced from the chip storage module 210, a channel 242 through which the suspension S flows, a first outlet 243 through which a first suspension S1 including a large amount of micro-semiconductor chips 15 is discharged to the first chip supply module 221, a second outlet 244 through which a second suspension S2 including a small amount of micro-semiconductor chips 15 is discharged to the second chip supply module 222, and a third outlet 245 through which a third suspension S including the impurities 16 is discharged to an impurity storage module 250.

The inlet 241 may be connected to a lower portion of the chip storage module 210, the first outlet 243 may be connected to an upper portion of the first chip supply module 221, and the second outlet 244 may be connected to an upper portion of the second chip supply module 222. The third outlet 245 may be connected to an upper portion of the impurity storage module 250. When at least one of the first and second valves 231 and 232 is opened, due to a pressure difference, the suspension S may naturally pass through the chip filtration module 240, and thus, the first or second suspension S1 or S2 including the micro-semiconductor chips 15 may be discharged to the first or second chip supply module 221 or 222 and the suspension S including the impurities may be stored in the impurity storage module 250.

The chip filtration module 240 may be formed on a substrate formed of at least one of silicon, glass, polymer, plastic, or a metal, and the channel 242 of the chip filtration module 240 may be embedded in the substrate. For example, the chip filtration module 240 may be formed by adhering a lower substrate having a plurality of channels 242 and a plurality of outlets e.g., 243, 244, and 245, on a surface thereof to an upper substrate having the inlet 241 while covering the channels 242. The channel 242 of the lower substrate may be formed by forming a negative photoresist on a silicon substrate and then performing partial etching. Alternatively, a plastic film on which the channel 242 is engraved may be made by injection molding plastic by using a patterned metal template.

An anti-adhesive film may be formed on an inner wall of at least one of the channel 242, the inlet 241, and the first to third outlets 243, 244, and 245 of the chip filtration module 240 to prevent the micro-semiconductor chips 15 from sticking and clogging the channel. When the micro-semiconductor chips 15 are light-emitting devices including an electrode, the anti-adhesive film may be hydrophobic. That is, a hydrophobic anti-adhesive layer may be formed on the inner wall of the channel 242 to prevent a hydrophilic electrode from being attached to the inner wall of the channel 242.

The chip filtration module 240 may separate the micro-semiconductor chips 15 from the impurities 16 by using at least one of microfluidic dynamics, sonophoretic dynamics, dielectrophoretic dynamics, magnetophoretic dynamics, a centrifugal force, and pinched flow fractionation.

Although the chip transfer module 110 supplies the micro-semiconductor chips 15 in the form of the suspension S in the above embodiment, the disclosure is not limited thereto. For example, the chip transfer module 110 may supply the plurality of micro-semiconductor chips 15 without supplying a liquid. The chip transfer module 110 may include a separate module for supplying a liquid, and may supply the plurality of micro-semiconductor chips 15 without supplying a liquid.

Figure 8:
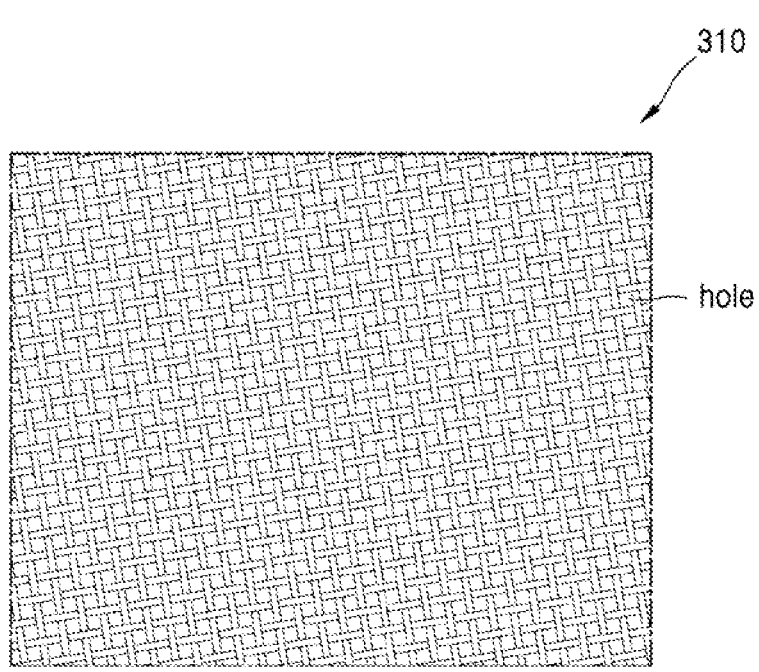
FIG. 8 is a view illustrating an absorbent material, according to an embodiment.

Referring to FIGS. 2 and 8, the chip alignment module 120 may include an absorbent material 310 for absorbing a liquid. The transfer substrate 10 may be scanned with the absorbent material 310. The chip alignment module 120 may move the absorbent material 310 along a surface of the transfer substrate 10. The absorbent material 310 may move along the surface of the transfer substrate 10 while in contact with the transfer substrate 10.

The absorbent material 310 may include, for example, fabric, tissue, fiber, paper, or a wiper. As the fiber, natural fiber such as cotton or silk may be used or artificial fiber such as nylon, polyester, or acryl may be used. However, the absorbent material 310 is not limited thereto, and may be any material as long as the absorbent material 310 may absorb the liquid L. For example, a micro-denier wiper may be used as the absorbent material 310. The micro-denier wiper has a thickness of 0.5 denier or less, and has a higher liquid absorption rate than that of a cotton material. The absorbent material 310 may be made of woven and knitted fabric.

FIG. 8 is a view illustrating the absorbent material 310, according to an embodiment. Woven fabric is produced by weaving horizontal threads (weft) and vertical threads (warp) together, and has a strength greater than that of knitted fabric. The absorbent material 310 may have a mesh structure capable of absorbing the liquid L. The absorbent material 310 may have a plurality of mesh holes, and a size of each mesh hole may be less than that of a micro-semiconductor chip 15 to prevent the micro-semiconductor chip 15 from being stuck or pinched.

The absorbent material 310 may be used alone without other auxiliary devices. However, the disclosure is not limited thereto, and the absorbent material 310 may be coupled to a support 312 (see, e.g., FIG. 9) to conveniently scan the transfer substrate 10 with the absorbent material 310.

The chip alignment module 120 may scan the transfer substrate 10 while the absorbent material 310 presses the transfer substrate 10 at an appropriate pressure. During the scanning of the chip alignment module 120, the absorbent material 310 may contact the transfer substrate 10 and may pass through the plurality of grooves 13. During the scanning, the liquid L may be absorbed by the absorbent material 310.

When the transfer substrate 10 is scanned with the absorbent material 310, the absorbent material 310 may absorb the liquid L in the plurality of grooves 13 while passing through the plurality of grooves 13. While the absorbent material 310 passes through the grooves 13, the liquid L in the grooves 13 may be absorbed, and in this process, the micro-semiconductor chips 15 may be aligned in the grooves 13.

Referring to FIGS. 1 and 2, the chip alignment module 120 according to an embodiment may include a plurality of chip alignment modules 120. For example, the chip alignment module 120 may include a first chip alignment module 121 for aligning a large amount of micro-semiconductor chips 15 in a plurality of grooves of the transfer substrate 10, and a second chip alignment module 122 for aligning a small amount of micro-semiconductor chips 15 in empty grooves not aligned by the first chip alignment module 121.

After the first chip alignment module 121 aligns the micro-semiconductor chips 15 on the transfer substrate 10, the second chip alignment module 122 may align the micro-semiconductor chips 15 in empty grooves in which the micro-semiconductor chips 15 are not aligned under the control of the controller 140 described below. The first chip alignment module 121 may be a main chip alignment module, and the second chip alignment module 122 may be an additional chip alignment module. However, the disclosure is not limited thereto. After both the first chip alignment module 121 and the second chip alignment module 122 align the micro-semiconductor chips 15 on the transfer substrate 10, the second chip alignment module 122 may align the micro-semiconductor chips 15 in empty grooves in which the micro-semiconductor chips 15 are not aligned under the control of the controller 140.

Figure 9:
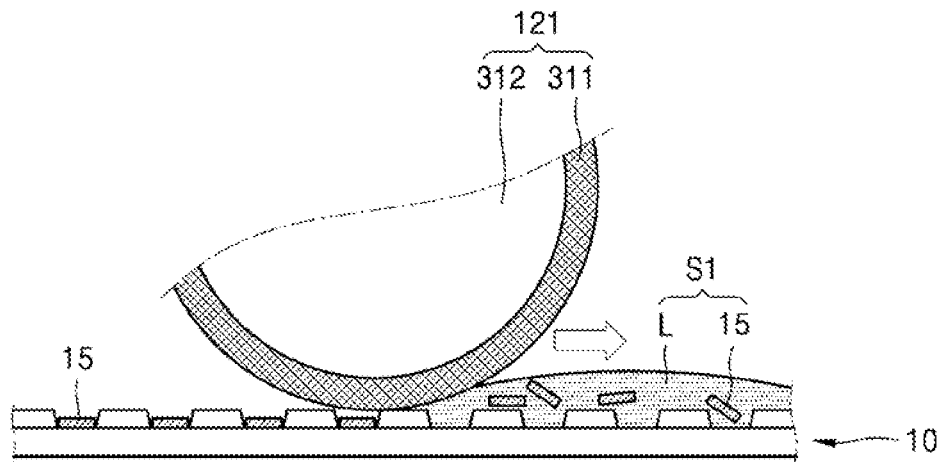
FIG. 9 is a view illustrating a first chip alignment module, according to an embodiment.

FIG. 9 is a view illustrating the first chip alignment module 121, according to an embodiment. Referring to FIG. 9, the first chip alignment module 121 may include a first absorbent material 311 for absorbing a liquid by contacting the transfer substrate 10 and a first support 312 for supporting the first absorbent material 311. The support 312 may have any of various shapes and structures suitable for scanning the transfer substrate 10. The support 312 may include a rod, a blade, a plate, or a wiper. The first absorbent material 311 may be provided on a surface of the first support 312, or may have a shape wound around the first support 312.

The first chip alignment module 121 may scan the transfer substrate 10 while the first absorbent material 311 presses the transfer substrate 10 at an appropriate pressure. In a scanning step, the first absorbent material 311 may contact the transfer substrate 10 and may pass through a plurality of grooves. During the scanning, the liquid L may be absorbed by the first absorbent material 311.

The scanning may be performed in various ways including at least one of, for example, a sliding method, a rotating method, a translating method, a reciprocating method, a rolling method, a spinning method, or a rubbing method of the first absorbent material 311, and may include both a regular method and an irregular method. Alternatively, the scanning may include at least one of a rotational motion, a translational motion, a rolling motion, or a spinning motion of the transfer substrate 10. Alternatively, the scanning may be performed by cooperation of the first absorbent material 311 and the transfer substrate 10. For example, the scanning may proceed when the transfer substrate 10 moves or rotates while the first absorbent material 311 presses the transfer substrate 10.

Figure 10:
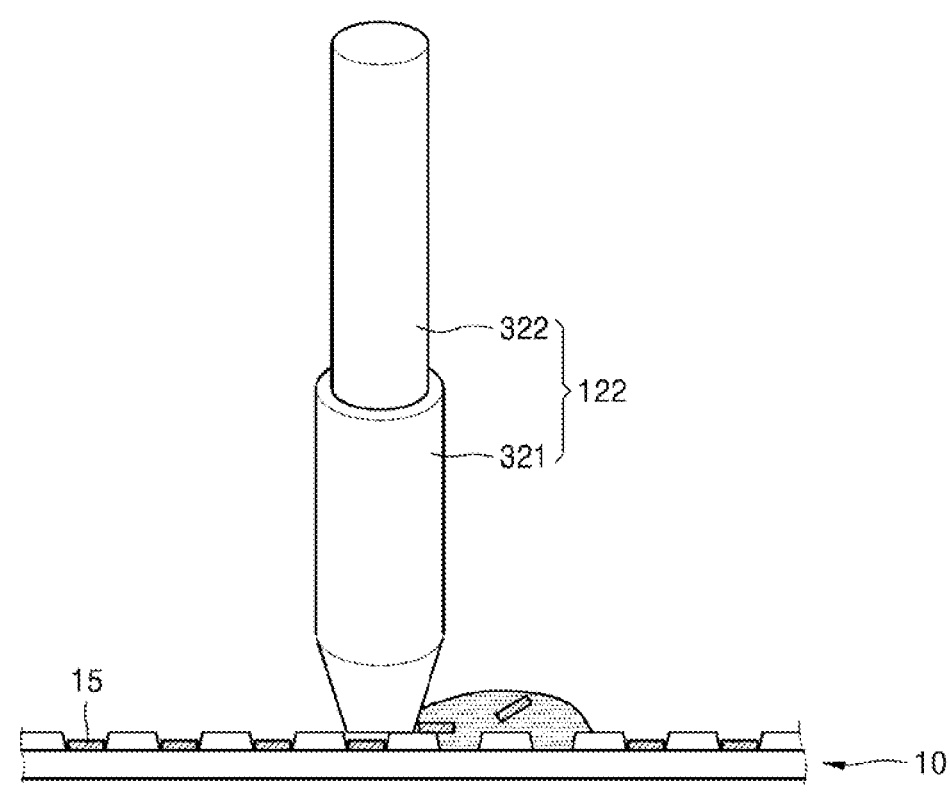
FIG. 10 is a view illustrating a second chip alignment module, according to an embodiment.

FIG. 10 is a reference view for describing the second chip alignment module 122, according to an embodiment. Referring to FIG. 10, the second chip alignment module 122 may include a second absorbent material 321 for absorbing a liquid by contacting the transfer substrate 10 and a second support 322 for supporting the second absorbent material 321. The second support 322 may include a rod, a blade, a plate, or a wiper, like the first support 312.

When FIGS. 9 and 10 are compared with each other, the first support 312 and the second support 322 may have bar shapes (e.g., a first bar shape and a second bar shape, respectively) having lengths greater than widths. Because the first chip alignment module 121 aligns a large amount of micro-semiconductor chips 15 and the second chip alignment module 122 aligns a small amount of micro-semiconductor chips 15, a dimension of the first support 312 may be greater than a dimension of the second support 322. For example, a volume of the first support 312 may be equal to or greater than 10 times a volume of the second support 322.

The first support 3121 may be arranged so that a length is parallel to a surface of the transfer substrate 10, whereas the second support 322 may be arranged so that a width is parallel to the surface of the transfer substrate 10. For example, when both the first and second supports 312 and 322 have bar shapes, a central axis of the first support 312 may be parallel to the surface of the transfer substrate 10, and a central axis of the second support 322 may be perpendicular to the surface of the transfer substrate 10. The first absorbent material 311 may be located on a side surface of the first support 312, and the second absorbent material 321 may be located on a bottom surface of the second support 322.

In order for the second absorbent material 321 to reduce a contact area between the second absorbent material 321 and the surface of the transfer substrate a lower portion of the second support 322 may have a tapered shape whose width decreases toward the transfer substrate 10. The second absorbent material 321 may be located on the lower portion of the tapered shape while surrounding the bottom surface of the second support 322. Even when the area of the bottom surface of the second support 322 is small, a contact area between the second absorbent material 321 and the transfer substrate 10 may be greater than a size of a hole.

The second chip alignment module 122 may perform scanning in various ways including at least one of a sliding method, a translating method, a reciprocating method, a spinning method, or a rubbing method. Alternatively, the scanning may include at least one of a translating method or a spinning method of the transfer substrate 10. For example, the first support 312 may rotate in a direction (e.g., a first direction) parallel to the surface of the transfer substrate 10, and the second support 322 may horizontally move in a direction (e.g., a second direction) parallel to the surface of the transfer substrate 10. The first direction and the second direction may be the same as or different from each other.

Referring back to FIGS. 1 and 2, the chip wet transfer apparatus 100 according to an embodiment may further include the inspection module 130 for inspecting a state of the transfer substrate 10. The inspection module 130 may be a camera capable of high-resolution image analysis. The inspection module 130 may inspect a state of the transfer substrate 10, through image analysis.

For example, the inspection module 130 may inspect an alignment state of the micro-semiconductor chips 15 on the transfer substrate 10. Based on a result of the inspection by the inspection module 130, the controller 140 may control at least one of the chip transfer module 110 and the chip alignment module 120 to operate. Through this, the alignment accuracy of the plurality of micro-semiconductor chips 15 may be improved.

For example, as a result of the inspection by the inspection module 130, positions of empty grooves in which the micro-semiconductor chips 15 are not aligned from among the plurality of grooves of the transfer substrate 10 may be identified. In this case, based on the result of the inspection by the inspection module 130, the controller 140 may control at least one of the semiconductor chip supply module and the chip alignment module to operate based on the identified positions of the empty grooves.

In an example, the inspection module 130 may inspect a supply state of the plurality of micro-semiconductor chips 15 and the liquid L on the transfer substrate 10.

As such, because the controller 140 controls at least one of the supply module and the chip alignment module 120 to operate based on the result of the inspection by the inspection module 130, the alignment accuracy of the plurality of micro-semiconductor chips 15 may be improved.

Because a process of supplying the micro-semiconductor chips 15 to the transfer substrate 10 and aligning the micro-semiconductor chips 15 in the grooves 13 of the transfer substrate 10 by using the chip transfer module 110 and the chip alignment module 120 is repeatedly performed multiple times, a transfer yield of the micro-semiconductor chips 15 may be increased. However, while the micro-semiconductor chips 15 are aligned, the micro-semiconductor chips 15 aligned in the grooves 13 may escape from the grooves 13.

For example, when a probability that the micro-semiconductor chips 15 supplied to the transfer substrate 10 enter the grooves of the transfer substrate 10 in one process of aligning the supplied micro-semiconductor chips 15 is $P_{in}$, a probability that the micro-semiconductor chips 15 escape from the grooves is $P_{out}$, and supply and alignment of the micro-semiconductor chips 15 are repeated N times, a probability PN that the micro-semiconductor chips 15 are aligned on the transfer substrate 10 is as shown in Equation 1.

$$P_N = \frac{P_{in}}{P_{in} + P_{out}}\left[1 - (1 - P_{in} - P_{out})^N\right] \qquad \langle\text{Equation 1}\rangle$$

When a process of supplying and aligning the micro-semiconductor chips 15 is sufficiently repeated, a transfer yield may be expected to converge to $$\frac{P_{in}}{P_{in} + P_{out}}.$$

It may be difficult to achieve a transfer rate of 100% unless a probability that the micro-semiconductor chips 15 aligned in the grooves escape again in the alignment process is 0.

The chip wet transfer apparatus 100 according to an embodiment may adjust a transfer rate. In the chip wet transfer apparatus according to an embodiment, because a large amount of micro-semiconductor chips 15 are aligned and then a small amount of micro-semiconductor chips 15 are selectively aligned in empty grooves of the transfer substrate 10 by using the large-capacity first chip transfer module 111, the small-capacity second chip transfer module 112, the large-capacity first chip alignment module 121, and the small-capacity second chip alignment module 122, a transfer rate of the micro-semiconductor chips 15 may be increased.

Figure 11:
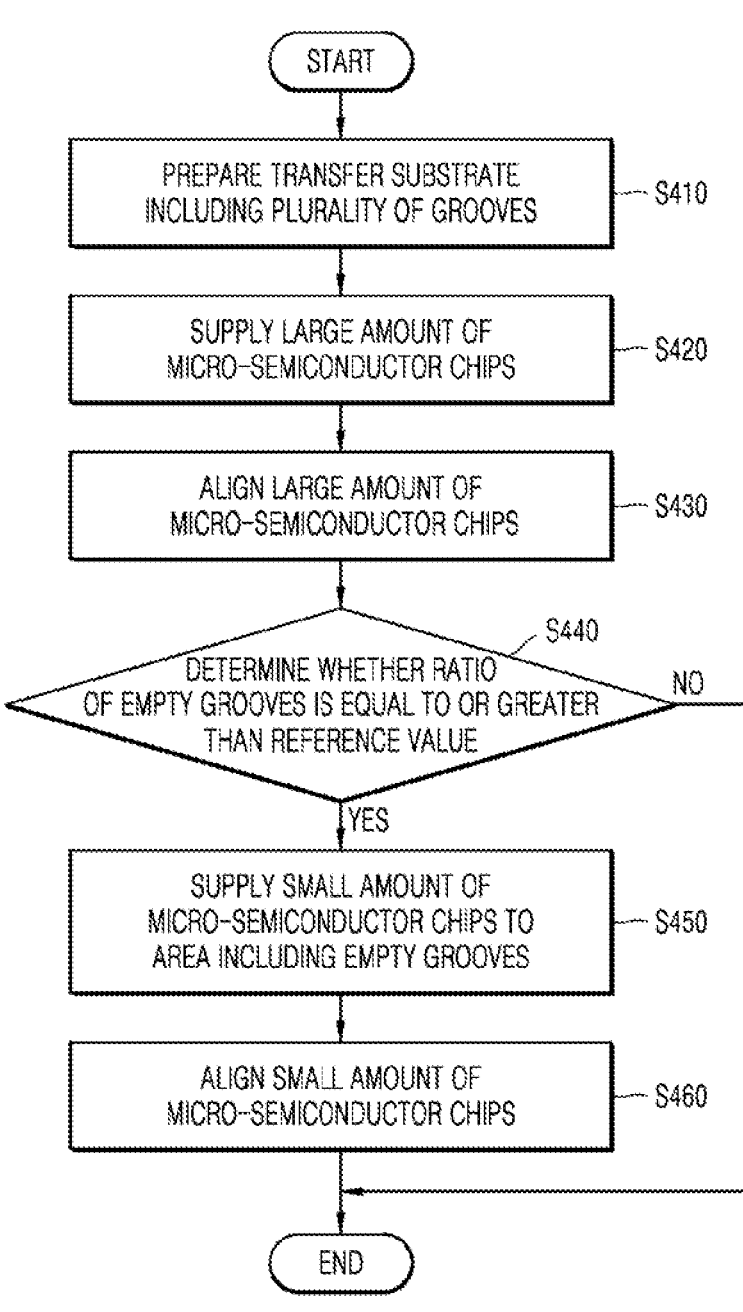
FIG. 11 is a reference view for describing a wet alignment method of micro-semiconductor chips, according to an embodiment.

FIG. 11 is a reference diagram for describing a wet alignment method of the micro-semiconductor chips 15, according to an embodiment.

Referring to FIG. 11, the transfer substrate 10 including a plurality of grooves is prepared (S410).

The transfer substrate 10 may include a single layer or a plurality of layers. The plurality of grooves may be provided to arrange one or more micro-semiconductor chips 15.

The first chip supply module 220 or 221 may supply a first suspension S1 including a large amount of micro-semiconductor chips 15 and a liquid to the transfer substrate 10 (S420). In this case, a method of supplying the micro-semiconductor chips 15 may be any of various methods such as a spraying method of the first suspension, a dispensing method, an inkjet dot method, or a flowing method. A method of supplying the micro-semiconductor chips 15 to the transfer substrate 10 is not limited thereto, and may be modified in various ways.

The first chip alignment module 121 may align a large amount of micro-semiconductor chips 15 with the first absorbent material 311 capable of absorbing the liquid L (S430). The first absorbent material 311 may be any material as long as the first absorbent material 311 may absorb the liquid L, and a shape or a structure of the first absorbent material 311 is not limited. The first absorbent material 311 may include, for example, fabric, tissue, polyester fiber, paper, or a wiper. The first absorbent material 311 may be used alone without other auxiliary devices. However, the disclosure is not limited thereto, and the first absorbent material 311 (e.g., 310) may be coupled to the first support 312 to conveniently scan the transfer substrate 10 with the first absorbent material 311. The first support 312 may have any of various shapes and structures suitable for scanning the transfer substrate 10. The first support 312 may include a bar, a blade, a plate, or a wiper.

For example, when the first support 312 has a bar shape having a length greater than a width, the first support 312 may be located on the transfer substrate 10 so that a central axis of the first support 312 is parallel to a surface of the transfer substrate 10. The first absorbent material 311 may be located on a side surface of the first support 312. The first absorbent material 311 may surround the side surface of the first support 312.

The transfer substrate 10 may be scanned with the first absorbent material 311 while the first absorbent material 311 presses the transfer substrate 10 at an appropriate pressure. The scanning may include a step in which the first absorbent material 311 contacts the transfer substrate 10 and passes through the plurality of grooves. During the scanning, the liquid L may be absorbed by the first absorbent material 311.

When the transfer substrate 10 is scanned with the first absorbent material 311, it may include that the first absorbent material 311 absorbs the liquid L in the plurality of grooves while passing through the plurality of grooves. While the transfer substrate 10 is scanned with the first absorbent material 311, one or more micro-semiconductor chips 15 may be attached to the first absorbent material 311. The first absorbent material 311 may contact the transfer substrate 10 and may pass through the plurality of grooves.

After the transfer substrate 10 is scanned with the first absorbent material 311, a state of the transfer substrate 10 may be inspected by the inspection module 130 and a result of the inspection may be applied to the controller 140.

The controller 140 may determine whether a ratio of a number of empty grooves to a number of all the grooves of the transfer substrate 10 is equal to or greater than a reference value based on the result of the inspection (S440). The reference value may be equal to or less than about 0.1%. For example, the controller 140 may calculate a ratio of empty grooves by using an image of the transfer substrate 10 received from the inspection module. The controller 140 may calculate a ratio of empty grooves to all the grooves in the entire image of the transfer substrate 10. Alternatively, the controller 140 may divide the entire image of the transfer substrate 10 into a plurality of areas, may determine a ratio of empty grooves to grooves included in each area, and may compare the determined ratio with the reference value.

When the ratio of the empty grooves to all the grooves is equal to or greater than the reference value (YES in S440), the controller 140 may control the second chip supply module and the second chip alignment module 122 to align the micro-semiconductor chips 15 in the empty grooves.

The controller 140 may identify positions of the empty grooves, and may control the second chip alignment module 122 to supply a small amount of micro-semiconductor chips 15 to an area including the empty grooves (S450). The area including the empty grooves may be equal to or less than $\frac{1}{110}$ of an area to which the large amount of micro-semiconductor chips 15 is supplied. The second chip alignment module 122 may supply a second suspension to the transfer substrate 10 at least once. The number of times the second chip alignment module 122 supplies the second suspension may be less than the number of times the first chip alignment module 121 supplies the first suspension. A density of the micro-semiconductor chips 15 included in the second suspension may be less than a density of the micro-semiconductor chips 15 included in the first suspension.

The second chip alignment module 122 may align a small amount of micro-semiconductor chips in the empty grooves (S460). A dimension of the second chip alignment module 122 may be less than a dimension of the first chip alignment module 121. A pressure applied by the second chip alignment module 122 to the transfer substrate 10 may be less than a pressure applied by the first chip alignment module 121 to the transfer substrate 10. Because the first chip alignment module 121 aligns a large amount of micro-semiconductor chips 15, the first chip alignment module 121 may press the transfer substrate 10 so that dummy micro-semiconductor chips 15 that are not aligned in the grooves and remain on the transfer substrate 10 do not exist. However, due to the pressure of the first chip alignment module 121, the micro-semiconductor chips 15 aligned in the grooves may escape from the grooves again. Because the second chip alignment module 122 applies a pressure less than that of the first chip alignment module 121 to the transfer substrate 10, the micro-semiconductor chips 15 aligned in the grooves may be prevented from escaping from the grooves.

Because the second chip alignment module 122 aligns the micro-semiconductor chips 15 in a small area of the transfer substrate 10, a contact area between the second chip alignment module 122 and the transfer substrate 10 may be less than a contact area between the first chip alignment module 121 and the transfer substrate 10. For example, a temporary contact area between the second absorbent material 321 of the second chip alignment module 122 and the transfer substrate 10 may be equal to or less than $\frac{1}{10}$ of a temporary contact area between the first absorbent material 311 of the first chip alignment module 121 and the transfer substrate 10. Here, a temporary contact area may refer to a contact area in a state where the first and second absorbent materials 311 and 321 contact the transfer substrate 10 and do not move. As described above, because the first alignment module and the second alignment module contact the transfer substrate 10 and perform scanning, an area in a state where the first chip alignment module 121 and the second chip alignment module 122 contact and are fixed may be defined as a temporary contact area.

Also, not only a temporary contact area between the second chip alignment module 122 and the transfer substrate 10 but also an overall contact area between the second chip alignment module 122 and the transfer substrate 10 in an alignment step may be less than a temporary contact area of the first chip alignment module 121. Accordingly, because the number of chips contacting the second chip alignment module 122 is small, a probability that the chips escape from the grooves may be reduced.

Figure 12:
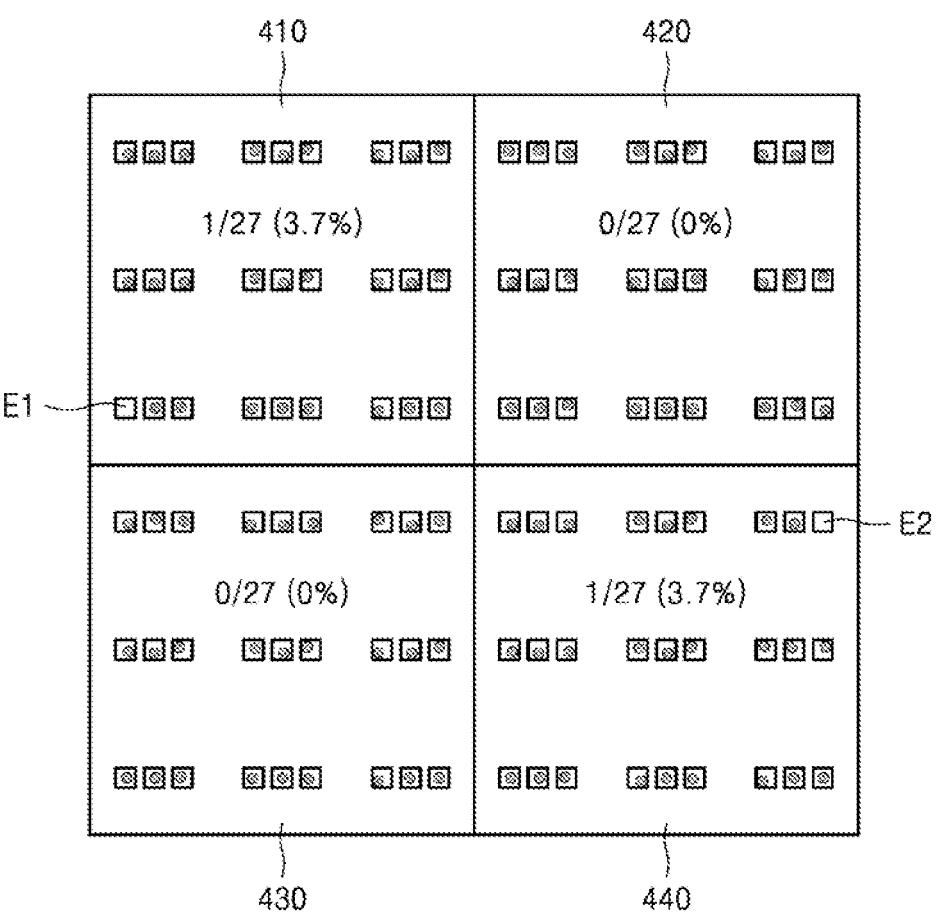
FIG. 12 is a view illustrating an image of a transfer substrate and a ratio of empty grooves for each area after a large amount of micro-semiconductor chips are aligned, according to an embodiment.

FIG. 12 is a view illustrating an image of a transfer substrate after a large amount of micro-semiconductor chips 15 are aligned, according to an embodiment. A ratio of empty grooves to all grooves of the transfer substrate 10 may be calculated. A ratio of empty grooves to all grooves of the transfer substrate 10 of FIG. 12 may be about 1.8%. When a reference value is 1%, the controller 140 may identify positions of empty grooves E1 and E2 in the transfer substrate 10 and may control movements of the first chip transfer module 112 or 222 and the second chip alignment module 122.

Alternatively, the controller 140 may divide the transfer substrate 10 into a plurality of areas 410, 420, 430, and 440, and may calculate a ratio of empty grooves to grooves of each area. The controller 140 may calculate a ratio of empty grooves of the first area 410 and the fourth area 440 as 3.7%. The controller 140 may determine positions of the empty grooves E1 and E2 only in the first area 410 and the fourth area 440. Because the transfer substrate 10 is divided into a plurality of areas, positions of empty grooves may be more easily identified.

The reference value may not be a fixed value. The controller 140 may divide the transfer substrate 10 into a plurality of areas and may calculate a ratio of empty grooves to grooves of each area. The controller 140 may determine an area whose ratio of empty grooves is higher than an average ratio of empty grooves, and may control movements of the second chip transfer module 112 or 222 and the second chip alignment module 122 to the determined area.

Figure 13:
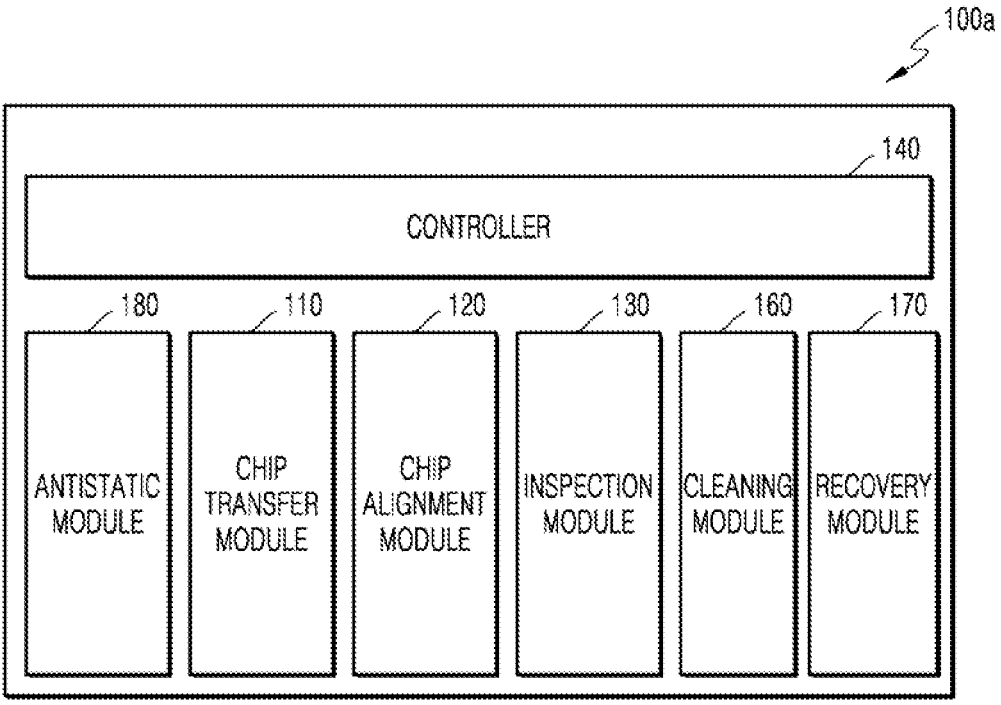
FIG. 13 is a diagram illustrating a chip wet transfer apparatus, according to an embodiment.

FIG. 13 is a diagram illustrating a chip wet transfer apparatus 100a, according to an embodiment. The chip wet transfer apparatus 100a may further include a cleaning module 160, a recovery module 170, and an antistatic module 180.

The cleaning module 160 may be configured to, after alignment of the plurality of micro-semiconductor chips 15 in a plurality of grooves 13 by the chip alignment module 120 is completed, remove dummy micro-semiconductor chips 15D remaining on a surface of the transfer substrate 10. The cleaning module 160 may remove the dummy micro-semiconductor chips 15D by using any of various methods.

Figure 14:
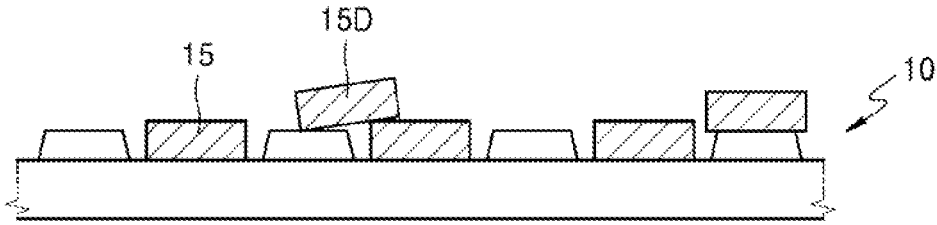
FIGS. 14 through 18 are reference views for describing a cleaning module, according to an embodiment.
Figure 15:
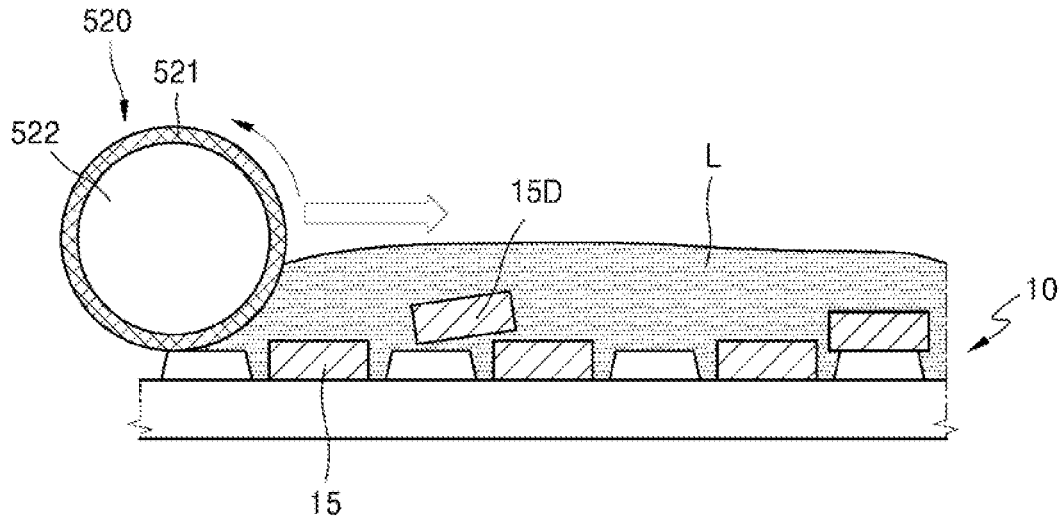

For example, referring to FIGS. 14 and 15, the cleaning module 160 may include a liquid supply module and a pressurization module. A second liquid supply module may supply the liquid L to the transfer substrate 10 to increase mobility of the dummy micro-semiconductor chips 15D.

The liquid L may be any liquid as long as the liquid L does not corrode or damage the micro-semiconductor chips 15. The liquid L may be the same as the liquid L supplied by the chip supply module 220, but the disclosure is not limited thereto. For example, the liquid L may be different from the liquid L supplied by the chip supply module 220.

The liquid L may include at least one of, for example, water, ethanol, alcohol, polyol, ketone, halocarbon, acetone, flux, or an organic solvent. The organic solvent may include, for example, isopropyl alcohol (IPA). The liquid L is not limited thereto, and various modifications may be made.

In a state where the liquid L is supplied, a pressurization module 520 (see, e.g., FIG. 15) may move while contacting and pressing the surface of the transfer substrate 10.

A pressure applied by the pressurization module 520 to the transfer substrate 10 may be greater than a pressure applied by an absorbent material of the chip alignment module 120 to the transfer substrate 10. Through this, in a scanning step by the chip alignment module 120, the dummy micro-semiconductor chips 15D attached to the surface of the transfer substrate 10 may be easily separated.

The dummy micro-semiconductor chips 15D may be separated from the surface of the transfer substrate 10 by the pressurization module 520, and may be transferred to the outside of the transfer substrate 10. Accordingly, the plurality of micro-semiconductor chips 15 may be aligned in the plurality of grooves 13 of the transfer substrate 10, and the dummy micro-semiconductor chips 15D may be removed.

The pressurization module 520 may be a member capable of pressing enough not to damage the dummy micro-semiconductor chips 15D.

For example, the pressurization module 520 may include an absorbent material 521 for absorbing the liquid L. The absorbent material 521 may include, for example, fabric, tissue, polyester fiber, paper, or a wiper. The absorbent material 521 may be used alone without other auxiliary devices. The pressurization module 520 may include a support 522 that supports the absorbent material 521. For example, the support 522 may include a rod, a blade, a plate, or a wiper. The absorbent material 521 may be provided on a surface of the support 522, and may have a shape wound around the support 522.

Figure 16:
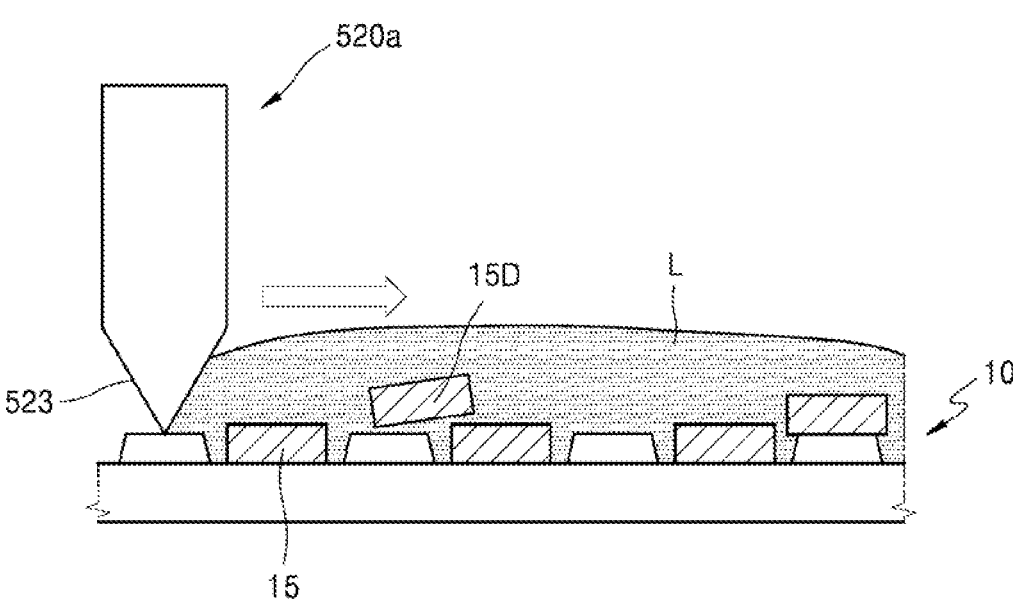

In an embodiment, as shown in FIG. 16, a pressurization module 520a may include an elastic member 523 that is elastically deformable, instead of the absorbent material 521. For example, the elastic member 523 may include a silicone material.

Referring back to FIG. 15, the dummy micro-semiconductor chips 15D may be attached to a surface of the absorbent material 521 of the pressurization module 520 in a cleaning process. Considering this point, the pressurization module 520 may have a rotatable structure. For example, the absorbent material 521 may rotate about a rotational axis. By rotating the absorbent material 521 under a certain condition or in a certain cycle, a surface of the absorbent material 521 to which the dummy micro-semiconductor chips 15D are attached may be turned back and a clean surface to which the dummy micro-semiconductor chips 15D are not attached may be located at a front end in a moving direction of the pressurization module 520. Accordingly, contamination of the surface of the transfer substrate 10 may be prevented due to the pressurization module 520.

However, a configuration of the cleaning module 160 is not limited thereto, and may be modified in various ways.

Figure 17:
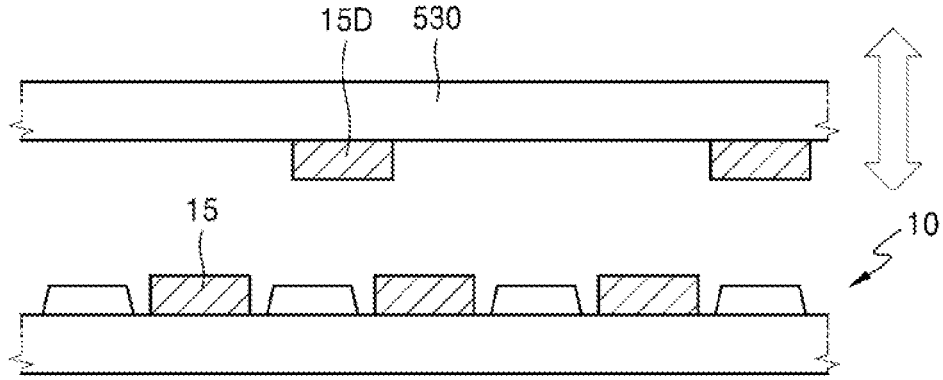
Figure 18:
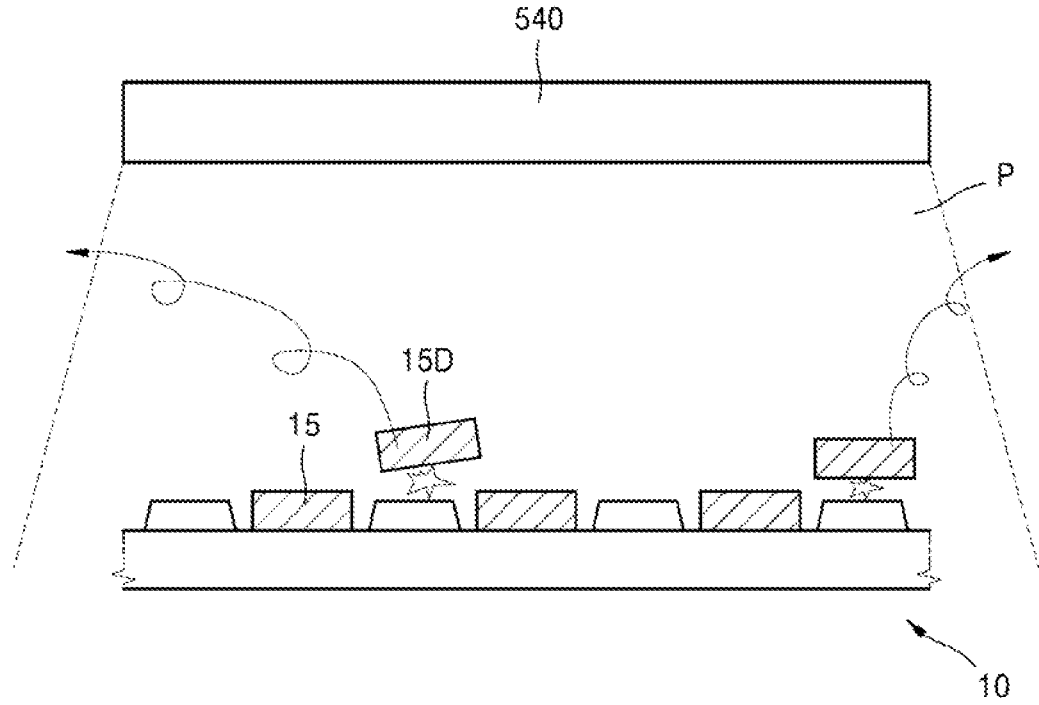

For example, referring to FIGS. 17 and 18, the cleaning module 160 may include an adhesive member 530. The cleaning module 160 may be configured so that the adhesive member 530 approaches and then moves apart from the transfer substrate 10. The adhesive member 530 may approach a height at which the adhesive member 530 contacts only the dummy micro-semiconductor chips 15D without contacting the surface of the transfer substrate 10. In this process, only the dummy micro-semiconductor chips 15D may be selectively adhered to the adhesive member 530. Accordingly, only the dummy micro-semiconductor chips 15D may be selectively removed from the transfer substrate 10.

In an example, referring to FIG. 18, the cleaning module 160 may include a light irradiator 540 for irradiating pulsed light P to the transfer substrate 10. The light irradiator 540 may be a pulse lamp. For example, the light irradiator 540 may be a xenon lamp. Because the liquid L or a foreign substance between the surface of the transfer substrate 10 and the dummy micro-semiconductor chips 15D is expanded due to the pulsed light P provided to the transfer substrate 10, the dummy micro-semiconductor chips 15D may be separated from the surface of the transfer substrate 10.

In an example, the cleaning module 160 may include a laser irradiator for locally irradiating a laser beam L to the transfer substrate 10. The laser irradiator may locally irradiate the laser beam L between the dummy micro-semiconductor chips 15D and the surface of the transfer substrate 10. The laser irradiator may selectively focus the laser beam L on an area under the dummy micro-semiconductor chips 15D, to separate the dummy micro-semiconductor chips 15D from the surface of the transfer substrate 10.

Figure 19:
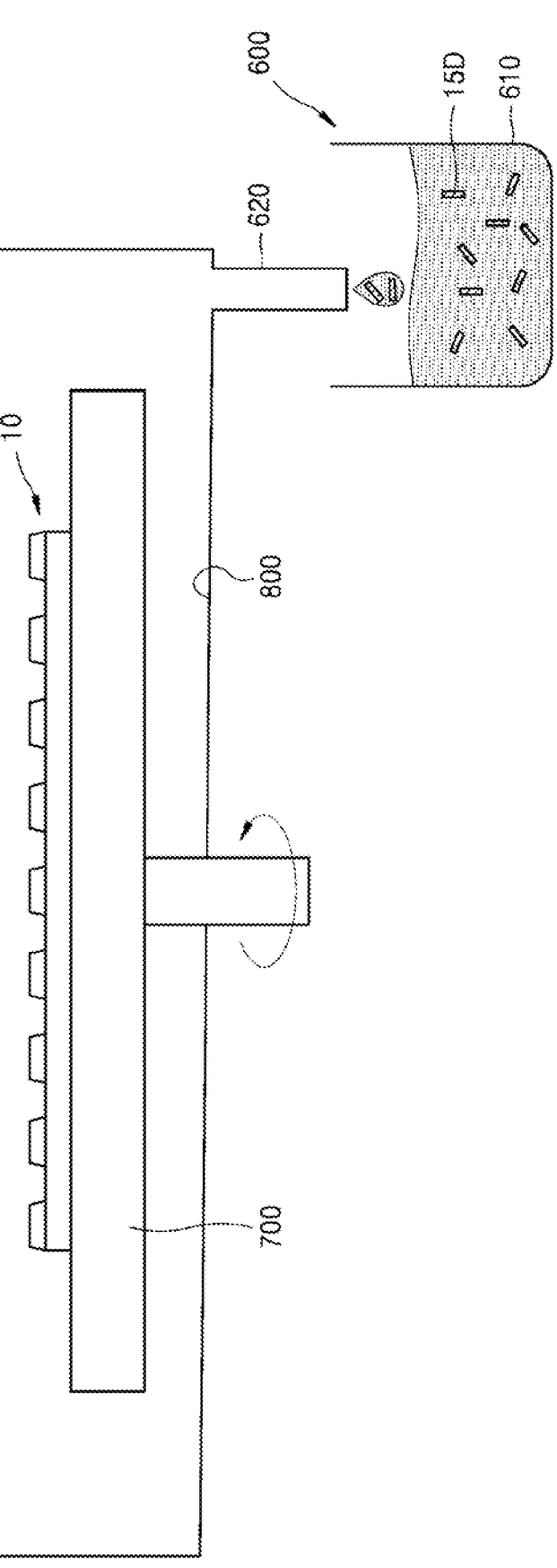
FIG. 19 is a view for describing a configuration for supporting a transfer substrate and a peripheral member thereof in a chip wet transfer apparatus, according to an embodiment.

FIG. 19 is a view for describing a configuration for supporting the transfer substrate 10 and a peripheral member thereof in a chip wet transfer apparatus. Referring to FIG. 19, the chip wet transfer apparatus 100 according to an embodiment may include a substrate support 700 and a recovery module 600. The recovery module 600 shown in FIG. 19 may correspond, for example, to the recovery module 170 shown in FIG. 13.

The substrate support 700 may support the transfer substrate 10. The substrate support 700 supports the transfer substrate 10 so that the transfer substrate 10 does not move unintentionally during relative movements of an absorbent material and the transfer substrate 10. The substrate support 700 may adsorb and support a bottom surface of the transfer substrate 10. The substrate support 700 may be rotatable. However, a support structure and an operation of the substrate support 700 are not limited thereto, and may be modified in various ways.

The recovery module 600 may recover the dummy micro-semiconductor chips 15D. The recovery module 600 may include an accommodation unit 610 for receiving the dummy micro-semiconductor chips 15D separated from the transfer substrate 10. The dummy micro-semiconductor chips 15D received in the accommodation unit 610 may be reused. The recovery module 600 may have a structure in which a fluid flows toward the accommodation unit 610 in a bottom surface 800 so that the micro-semiconductor chips 15 are transferred toward the accommodation unit 610. The bottom surface may be downwardly inclined toward a drain port 620.

The chip wet transfer apparatus 100 according to an embodiment may further include the antistatic module 180 for supplying ions onto the transfer substrate to remove static electricity on the transfer substrate 10.

The plurality of micro-semiconductor chips 15 are very small, and thus, may be damaged or unintentionally moved even with a small amount of static electricity. Considering this point, the antistatic module 180 may supply ions for preventing static electricity to the transfer substrate 10 or the plurality of micro-semiconductor chips 15.

Figure 20:
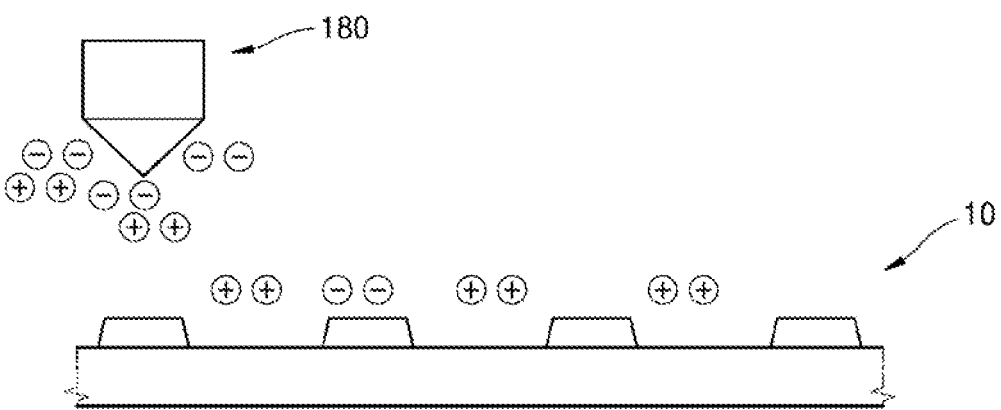
FIGS. 20 and 21 are reference views for describing an antistatic module, according to an embodiment.
Figure 21:
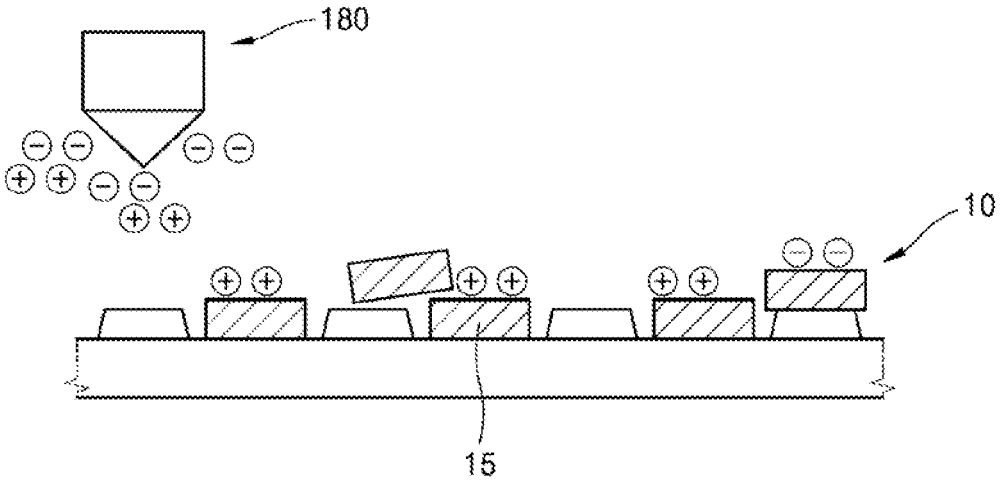

For example, referring to FIG. 20, the antistatic module 180 may supply ions for preventing static electricity to the transfer substrate 10 before the plurality of micro-semiconductor chips 15 are supplied onto the transfer substrate 10. In an embodiment, referring to FIG. 21, the antistatic module 180 may supply ions for preventing static electricity after the plurality of micro-semiconductor chips 15 are supplied to the transfer substrate 10 and aligned to some extent.

The chip wet transfer apparatus according to an embodiment may further include a chip extraction module for extracting the micro-semiconductor chips 15 attached to the absorbent material.

Figure 22:
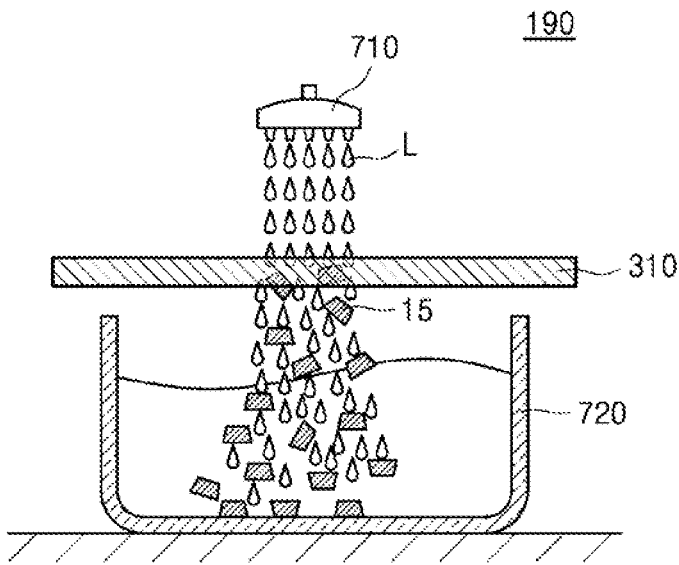
FIG. 22 is a view illustrating a chip extraction module, according to an embodiment.

FIG. 22 is a view illustrating a chip extraction module, according to an embodiment. The chip extraction module may extract and recover the micro-semiconductor chips 15 remaining on the absorbent material 310 after the transfer substrate 10 is scanned with the absorbent material 310. The chip extraction module 151 may include a liquid injection cleaner 710 configured to extract the micro-semiconductor chips 15 from the absorbent material 310 by spraying the liquid L onto the absorbent material 310. The liquid injection cleaner 710 may be located at any of various positions as long as the liquid injection cleaner 710 may effectively extract the micro-semiconductor chips 15 from the absorbent material 310. For example, the liquid injection cleaner 710 may be located above the absorbent material 310, and may spray the liquid L toward the absorbent material 310 to separate the micro-semiconductor chips 15 remaining on the absorbent material 310. A water tank 720 may be provided below the absorbent material 310, and may collect the micro-semiconductor chips 15 separated from the absorbent material 310.

Also, the liquid injection cleaner 710 may be movably configured, and may spray a liquid uniformly over the entire area of the absorbent material 310 or selectively only to a required area.

The liquid injection cleaner 710 may include a pressure device for spraying high-pressure liquid droplets, a flow control valve, a solenoid valve, a pressure gauge, and one or more nozzles. An area where liquid droplets are sprayed may be wider than an area where the micro-semiconductor chips 15 are attached in a scanning process. The liquid injection cleaner 710 may include a plurality of nozzles to simultaneously spray a liquid to a wide area of the absorbent material 310, or may be configured to spray a liquid while moving one nozzle. When the liquid injection cleaner 710 includes one nozzle, the liquid injection cleaner 710 may be configured to spray a liquid while rotating the nozzle.

The liquid L may be any liquid as long as the liquid L does not corrode or damage the micro-semiconductor chips 15 and the absorbent material 310. The liquid L may include at least one of, for example, water, ethanol, alcohol, polyol, ketone, halocarbon, acetone, flux, or an organic solvent. The organic solvent may include, for example, isopropyl alcohol (IPA). The liquid L is not limited thereto, and various modifications may be made.

An electronic device may be manufactured by using the wet transferred micro-semiconductor chips 15. When the micro-semiconductor chips 15 are light-emitting diodes, a display device may be manufactured by using the wet transferred micro-semiconductor chips 15.

While the chip wet transfer apparatus and the operating method thereof have been particularly shown and described with reference to embodiments thereof, they are provided for the purposes of illustration and it will be understood by one of ordinary skill in the art that various modifications and equivalent other embodiments may be made from the disclosure. Although many matters have been described in detail in the above description, they should be interpreted as examples of specific embodiments rather than limiting the scope of the disclosure. The scope of the disclosure should not be defined by the above embodiments but should be defined by the following claims.

Because a large amount of micro-semiconductor chips are supplied and aligned and then a small amount of micro-semiconductor chips are selectively supplied and aligned in empty holes, a transfer rate of the micro-semiconductor chips may be increased.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims and their equivalents.

What is claimed is:

1. A chip wet transfer apparatus for transferring a plurality of micro-semiconductor chips to a transfer substrate, the transfer substrate comprising a plurality of grooves, the chip wet transfer apparatus comprising:

a first chip supply module configured to supply, to the transfer substrate, a first suspension comprising the plurality of micro-semiconductor chips and a liquid;

a first chip alignment module configured to align the plurality of micro-semiconductor chips of the first suspension in one or more of the plurality of grooves;

a second chip supply module configured to supply a second suspension comprising the plurality of micro-semiconductor chips and the liquid, the second suspension having a smaller volume than a volume of the first suspension, to the transfer substrate;

a second chip alignment module configured to align the plurality of micro-semiconductor chips of the second suspension in grooves from among the plurality of grooves that remain empty after the plurality of micro-semiconductor chips included in the first suspension are aligned;

an inspection module, comprising a processor, configured to inspect a state of the transfer substrate after operations of the first chip supply module and the first chip alignment module; and a controller, comprising a processor, configured to identify positions of empty grooves in the transfer substrate where the micro-semiconductor chips of the first suspension are not aligned, based on the inspected state of the transfer substrate and control operations of the second chip supply module and the second chip alignment module to supply the second suspension to the empty grooves in the transfer substrate, based on the identified positions of the empty grooves in the transfer substrate.

2. The chip wet transfer apparatus of claim 1, wherein the controller is further configured to transfer the plurality of micro-semiconductor chips included in the second suspension to the empty grooves by controlling an operation of at least one of the second chip supply module and the second chip alignment module when a ratio of a number of the empty grooves to a number of all of the plurality of grooves of the transfer substrate is equal to or greater than a reference value.

3. The chip wet transfer apparatus of claim 2, wherein the controller is further configured to:

divide the transfer substrate into a plurality of areas, for each of the plurality of areas, determine whether the ratio of the number of the empty grooves to the number of all of the plurality of grooves is equal to or greater than the reference value, and control the operation of the at least one of the second chip supply module and the second chip alignment module to transfer the plurality of micro-semiconductor chips included in the second suspension to an area from among the plurality of areas of the transfer substrate having the ratio equal to or greater than the reference value.

4. The chip wet transfer apparatus of claim 2, wherein the reference value is equal to or less than 0.1%.

5. The chip wet transfer apparatus of claim 1, wherein an area to which the plurality of micro-semiconductor chips included in the second suspension is supplied is equal to or less than $\frac{1}{10}$ of an area to which the plurality of micro-semiconductor chips included in the first suspension is supplied.

6. The chip wet transfer apparatus of claim 1, wherein the first chip supply module supplies the first suspension while moving along a surface of the transfer substrate.

7. The chip wet transfer apparatus of claim 1, wherein a density of the plurality of micro-semiconductor chips included in the second suspension is less than a density of the plurality of micro-semiconductor chips included in the first suspension.

8. The chip wet transfer apparatus of claim 1, wherein the second chip supply module is further configured to sequentially transfer the plurality of micro-semiconductor chips to the transfer substrate one by one.

9. The chip wet transfer apparatus of claim 1, wherein the first chip supply module and the second chip supply module share a chip storage module in which the first suspension and the second suspension are stored.

10. The chip wet transfer apparatus of claim 9, wherein the first chip supply module is connected to a lower end of the chip storage module, and wherein the second chip supply module is connected to a side end of the chip storage module.

11. The chip wet transfer apparatus of claim 9, further comprising:

a first valve configured to control a flow of the first suspension from the chip storage module to the first chip supply module; and a second valve configured to control a flow of the second suspension from the chip storage module to the second chip supply module.

12. The chip wet transfer apparatus of claim 11, further comprising a controller configured to control operations of the second chip supply module and the second chip alignment module, wherein, while the second valve is opened so that the second chip supply module supplies the second suspension, the controller is configured to control the first valve to be maintained in a locked state.

13. The chip wet transfer apparatus of claim 9, further comprising a chip filtration module configured to separate the plurality of micro-semiconductor chips from impurities in the first suspension and the second suspension, wherein the chip filtration module is further configured to move the first suspension from which the impurities are removed to the first chip supply module or move the second suspension from which the impurities are removed to the second chip supply module.

14. The chip wet transfer apparatus of claim 13, wherein the impurities comprise damaged micro-semiconductor chips.

15. The chip wet transfer apparatus of claim 14, wherein the chip filtration module is further configured to separate the plurality of micro-semiconductor chips from the impurities by using at least one of sonophoretic dynamics, dielectrophoretic dynamics, magnetophoretic dynamics, microfluidic dynamics, a centrifugal force, and pinched flow fractionation.

16. The chip wet transfer apparatus of claim 1, wherein a pressure applied by the second chip alignment module to the transfer substrate is less than a pressure applied by the first chip alignment module to the transfer substrate.

17. The chip wet transfer apparatus of claim 1, wherein the first chip alignment module comprises a first absorbent material for absorbing the liquid of the first suspension, wherein the second chip alignment module comprises a second absorbent material for absorbing the liquid of the second suspension, and wherein a temporary contact area between the second absorbent material and the transfer substrate is equal to or less than $\frac{1}{10}$ of a temporary contact area between the first absorbent material and the transfer substrate.

18. The chip wet transfer apparatus of claim 17, wherein the first chip alignment module comprises a first support having a first bar shape whose central axis is parallel to a surface of the transfer substrate, wherein the first absorbent material is located on a side surface of the first support, and wherein the second chip alignment module comprises a second support having a second bar shape whose central axis is perpendicular to the surface of the transfer substrate, wherein the second absorbent material is located on an end portion of the second support facing the transfer substrate.

19. The chip wet transfer apparatus of claim 18, wherein the first support is rotatable in a first direction parallel to the surface of the transfer substrate, and wherein the second support is horizontally movable in a second direction parallel to the surface of the transfer substrate.

* * * * *